United States Patent [19]

Flatau et al.

[11] Patent Number: 5,406,153
[45] Date of Patent: Apr. 11, 1995

[54] MAGNETOSTRICTIVE VIBRATION GENERATION SYSTEM

[75] Inventors: Alison Flatau; David Hall, both of Ames, Iowa

[73] Assignee: Iowa State University Research Foundation, Inc., Ames, Iowa

[21] Appl. No.: 901,534

[22] Filed: Jun. 19, 1992

[51] Int. Cl.$^6$ .......................................... H01L 41/12
[52] U.S. Cl. .................................................. 310/26
[58] Field of Search .......................... 310/26, 15, 17; 318/118

[56] References Cited

U.S. PATENT DOCUMENTS 4,749,891 6/1988 Sheng ...................................... 310/15
5,184,037 2/1993 Kobayashi et al. ................... 310/26

OTHER PUBLICATIONS

ABB Seatech AS brochures entitled *Low-Frequency Transducers Based on Terfenol*. 4 pages. (undated).
Magespro S.A. brochure entitled *Underwater Loudspeaker for Leisure, Sport and for Professionals.* 1 page. (undated).
Sketch of Terfenold-D Vibrator Construction produced by Edge Technologies, Inc., Ames, Iowa, drawn on Jan. 19, 1994.
Verhoeven, J. D., Gibbons, E. D., and McMasters, O. D., "The Growth of Single Crystal Terfenol-D Crystals," *Metals Transactions*, vol. 18A, p. 223, 1987 month unknown.
Verhoeven, J. D., Gibbons, E. D., McMasters, O. D., and Ostenson, J. E., "Directional Solidification and Heat Treatment of Terfenol-D Magnetorestrictive Materials," *Metals Transaction*, vol. 21A, p. 2249, 1990 month unknown.
Jiles, D. C., "Development and Characterization of Terfenol-D for Use in Sensors and Actuators," *New Materials and Their Applications*, edited by D. Holland, Institute of Physics, London, p. 365, 1990 month unknown.
Hiller, M. W., Bryant, M. D., and Umegaki, J., "Attenuation and Transformation of Vibration Through Active Control of Magnetostrictive Terfenol," *Journal of Sound and Vibration*, vol. 134, No. 3, pp. 507–519, 1989 month unknown.
Miller, C. G., "High Force, High Strain, Wide Bandwidth Linear Actuators Using the Magnetostrictive Material Terfenol-D", *Proceedings on the Conference on Recent Advances in Active Control of Sound and Vibration*, Technomic Publishing Co., Inc., Lancaster, Pa., 1991 month unknown.
Harris, C. M., *Shock and Vibration Handbook*, third edition, pp. 25-1 to 25-26, McGraw-Hill, New York, N.Y., 1988 month unknown.
Butler, J. L., "Application Manual for the Design of Etrema Terfenol-D Magnetostrictive Transducers," Etrema Division, Edge Technologies, Inc., 1988 month unknown.
"Terfenol-D Notes", vol. 4, No. 1, p. 4, Edge Technologies, Jan. 1991.
"Magnetostrictive Actuators", Edge Technologies, Etrema Products Division date unknown.

*Primary Examiner*—Steven L. Stephan
*Assistant Examiner*—Judson H. Jones
*Attorney, Agent, or Firm*—Schwegman, Lundberg & Woessner

[57] ABSTRACT

A shaker with a Terfenol-D rod actuator includes a mass coupled to both ends of the rod through a spring seat, a spring seat/adjuster and a spring washer. The actuator is mounted inside a cylindrical coil, which in turn is mounted inside a cylindrical permanent magnet, which in turn is mounted inside a cylindrical housing. An electrical drive system provides a predetermined excitation signal to the coil to cause the rod to vibrate under the influence of the magnetic field generated by the coil. One embodiment features a vibrating mass on one end of the rod. An implantable shaker includes a seal to leak-proof the shaker and a coating of Biomer TM. The implantable shaker can be implanted in an animal to test tissue response to certain vibrations. According to another embodiment, the Terfenol-D rod actuator is held in place on one end with a pre-stress adjusting screw, which is threaded into the end of the housing and fixed in place with a jam nut. In all embodiments, a spring base is seated on one end of the rod actuator and forms an annular coaxial air gap between it and a spring seat, so that the air gap remains constant when the rod actuator vibrates and the spring base moves coaxially with respect to the spring seat.

27 Claims, 21 Drawing Sheets

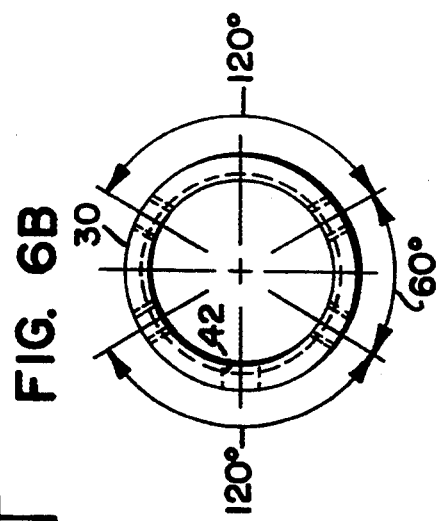
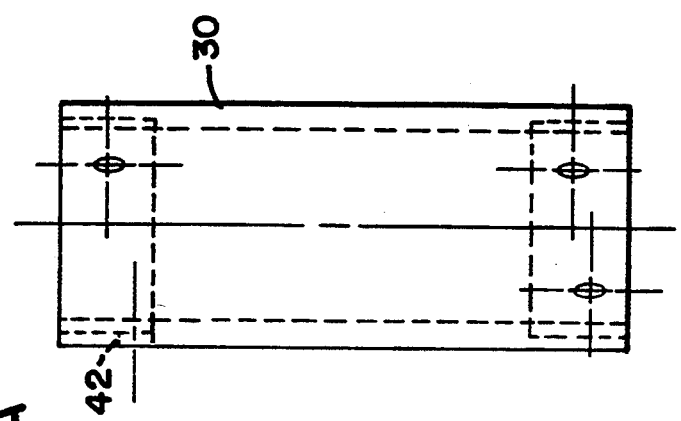
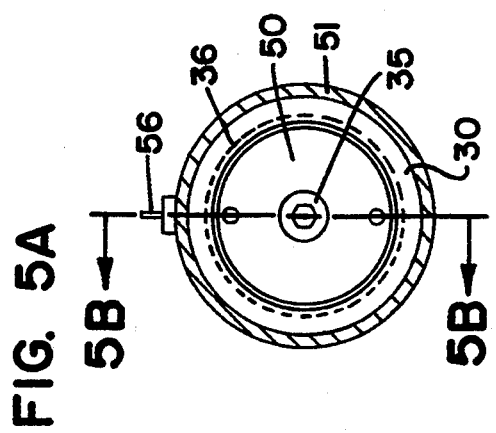
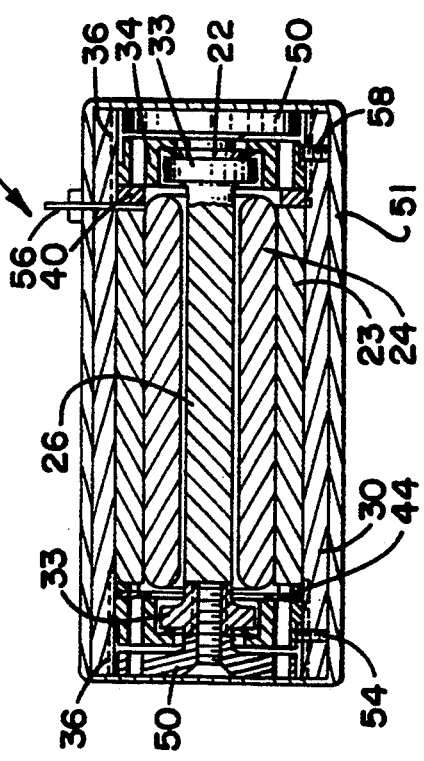

ZONE OF EDDY CURRENT REDUCED MAGNETIC FIELD INTENSITY

ANNULAR ZONE OF ENHANCED MAGNETIC FIELD INTENSITY

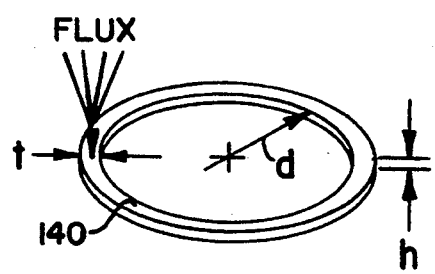
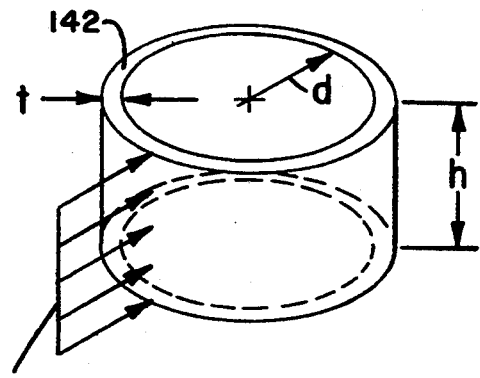
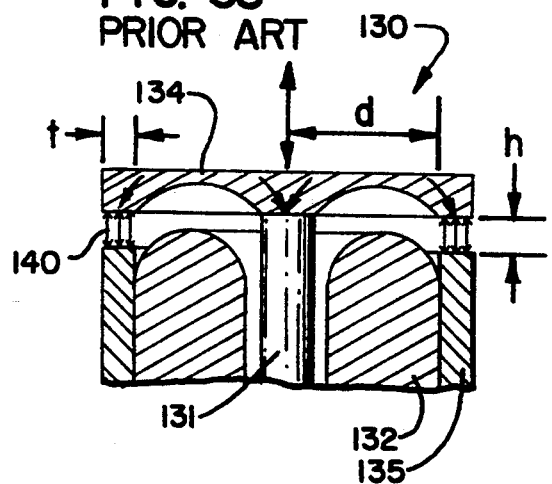
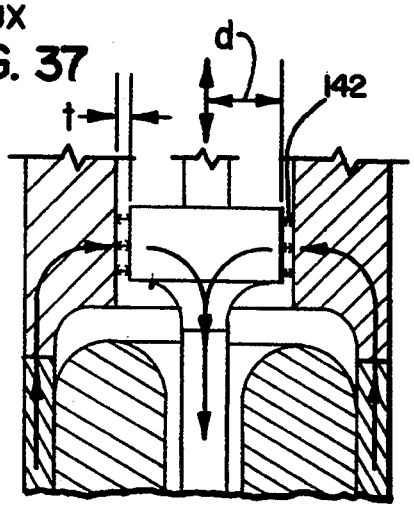
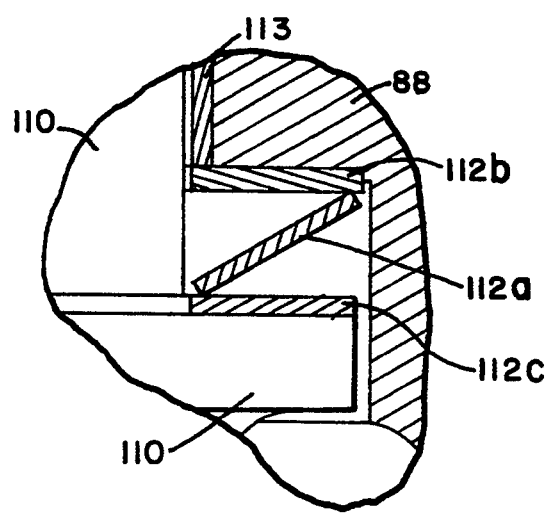

MAGNETOSTRICTIVE VIBRATION GENERATION SYSTEM

TECHNICAL FIELD OF THE INVENTION

This invention pertains generally to vibration generation systems, or "shakers," and more particularly to a vibration generation system using magnetostrictive material for the actuator.

BACKGROUND OF THE INVENTION

Vibration generation systems, or "shakers," have a variety of uses, including:

(a) calibration of acceleration, velocity and displacement transducers;
(b) vibration testing;
(c) structural acoustics testing;
(d) resonance searching;
(e) study of the dynamic and acoustic properties of structures and structural models;
(f) mechanical impedance and mobility measurements;
(g) structural response testing;
(h) educational demonstration of vibration and acoustic phenomenon;
(i) fatigue testing of specimens;
(j) environmental testing of objects and structures; and
(k) active sound and vibration control.

In some of the above-noted uses, there is a need for a compact, lightweight, high-force vibration source that can be used in confined spaces where conventional systems (such as mechanical, hydraulic, pneumatic or electromagnetic systems) would not fit. Other uses require a shaker with low power consumption to permit battery operation, for example for portable applications. Quiet operation may be required for other applications, such as in acoustics research. Still other applications may require a shaker with minimal heat dissipation. Moreover, there is always a need for reliable operation.

Some applications require a shaker with all of the above-noted characteristics, i.e. a compact, lightweight, portable, quiet, high-force shaker with low heat dissipation. For example, without limitation, one need for such a source is in the study of tissue response in mammals to the mechanical vibrations generated by artificial hearts and ventricular-assist devices. These studies require a shaker that can be implanted in research animals (calves) for reproducing complicated acceleration vibration patterns measured in an artificial heart, with peak levels up to 100 times gravity (981 meter per second squared), and various other requirements, including that it be small in volume, or "compact" enough to be implanted in the thoracic cavity, that it be lightweight so that it does not mass load or compress surrounding tissue, that it not require high voltages or currents, that it not heat up significantly during the operation, and that it be portable and capable of operating with batteries as the power supply.

As described more fully below, the magnetostrictive vibration generation system of the present invention attains a unique combination of characteristics which can individually or together meet a wide variety of unique requirements for shaker systems.

SUMMARY OF THE INVENTION

The present invention provides a magnetostrictive vibration generation system, or "shaker." Controlled oscillations are produced by the oscillating strain in a driving element of magnetostrictive material when it is subject to a changing magnetic field orientation. The changing magnetic field orientation is generated by switching direction of current flow through a coil wound around the magnetostrictive driving element.

The magnetostrictive shaker of the present invention can be fabricated in a broad array of sizes, force levels and operating frequency ranges. A magnetostrictive shaker according to the present invention which is rated for a given output force is more compact than similarly-rated permanent magnet and electrodynamic shaker systems, allowing for its use in confined spaces where existing systems would not fit. In addition, a magnetostrictive shaker according to the present invention has fewer moving parts than many existing systems and is significantly quieter during operation, a highly desirable feature for vibration generation systems used in conjunction with acoustics research. Moreover, the magnetostrictive shaker, according to the present invention, operates at a much larger strain or displacement level than piezoelectric systems, and does not require the use of pneumatic or hydraulic supply lines for operation.

According to one embodiment of the invention, there is provided a shaker comprising a magnetostrictive rod actuator and a coil positioned adjacent the actuator. At least one mass is coupled to one end of the actuator. A signal source provides an excitation signal, the signal being applied to the coil to vary the magnetic field applied to said actuator in magnitude and direction and cause the mass to vibrate with the expansion and contraction of the actuator. The shaker is further designed to provide for a well formed magnetic circuit around the actuator.

According to another embodiment, the mass is coupled to the actuator using a spring, and the other end of said actuator is stationary. According to another embodiment, an additional mass is coupled to the other end of the actuator, and each of the masses is coupled to the actuator with a spring. This embodiment may be mounted with both ends free so that the vibrations of the shaker are generally symmetrical about the midpoint of the actuator.

According to another embodiment of the shaker, it is sealed to make it leak-proof for implantation in an animal body.

BRIEF DESCRIPTION OF THE DRAWINGS

FIG. 5a is a top plan view of an end of a shaker according to the present invention;

FIG. 5b is a longitudinal cross-sectional view taken along the lines 5b–5b of FIG. 5a, to scale, of the shaker according to the present invention;

FIG. 6 is perspective view of the housing of the shaker according to the present invention;

FIG. 35 is an exploded partial view of the spring washer arrangement of the shaker embodiment 80 according to the present invention;

FIG. 37 is an illustration of the air gap geometry of the shakers according to the present invention;

FIG. 38 is an illustration of the air gap geometry of a prior art transducer design;

FIGS. 39 and 40 are illustrations of the air gap geometry of the shaker designs illustrated in FIGS. 37 and 38, respectively;

DETAILED DESCRIPTION OF THE INVENTION

Figure 1:
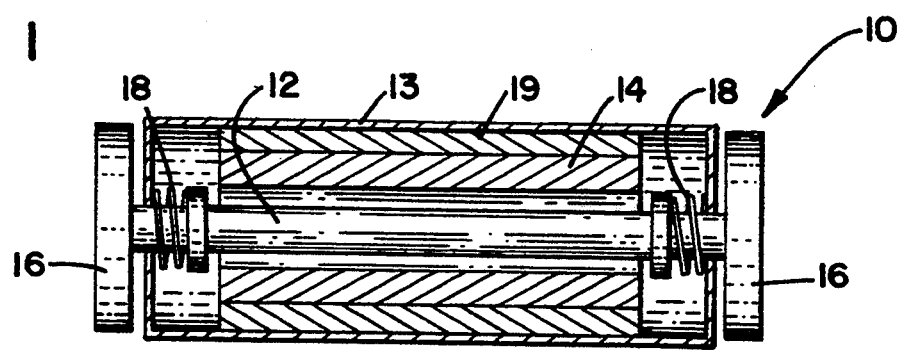
FIGS. 1 and 2 are longitudinal cross-sections of shakers according to the present invention, with FIG. 1 showing the Terfenol-D rod actuator in a collapsed condition and FIG. 2 showing the rod in an expanded condition.
Figure 2:
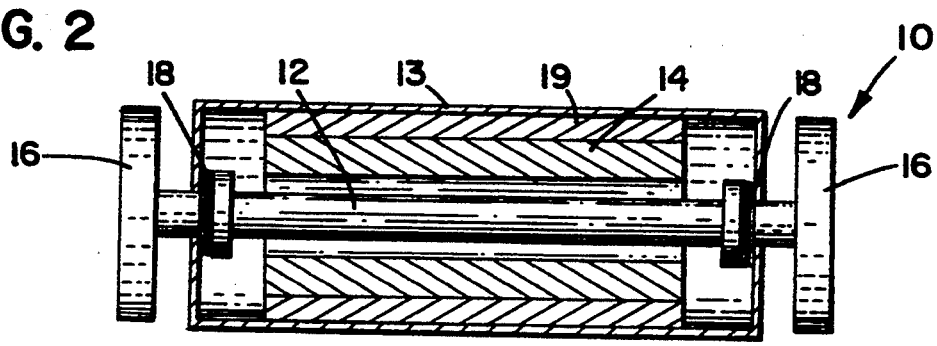

Referring to FIGS. 1 and 2, there is shown a simplified diagram of one embodiment 10 of the vibration generation system, or "shaker," according to the present invention. A Terfenol-D rod 12 is positioned in the bore of a solenoid 14, which in turn is positioned inside permanent magnet 19, so that the magnetic field to which the rod is subjected can be varied by controlling the current in the solenoid. Permanent magnet 19, solenoid 14 and rod 12 are mounted in housing 13. The strength of the magnetic field determines the length of the Terfenol-D rod 12 while the length of the rod determines the positions of the end caps. If the current is varied "quickly," the end caps move fast, or "vibrate." Symmetry implies that the midpoint of the rod (along its length) remains approximately stationary in relation to the housing. FIG. 1 shows the Terfenol-D rod 12 in its unexcited or collapsed state, and FIG. 2 in its expanded state under the influence of a magnetic field introduced by coil 14 and magnet 19.

Coil 14 "adds" or "subtracts" magnetic flux to and from the magnetic circuit. Adding flux occurs when the electrical current in the solenoid is such that its resulting magnetic field increases the flux density in the Terfenol-D rod 12. Reversing the current flow direction reverses the induced magnetic field of the solenoid 14. No current in the solenoid 14 means no induced magnetic field, i.e., the only magnetic flux in the circuit is due to the permanent magnet 19. When the magnetic field in the rod 12 is reduced to a minimum by subtraction of field from the permanent magnet 19, the rod 12 is in the "collapsed" condition. When the field is maximized by addition of field strength to the permanent magnet 19, the rod 12 is in the "expanded" condition.

Vibrating masses 16 are spring loaded with springs 18 on both ends of the shaker 10. Springs 18 keep the masses in contact (at all times) with the ends of the Terfenol-D rod 12 and increase the effective displacement of the end caps by providing a compressive pre-stress to the Terfenol-D.

Figure 3:
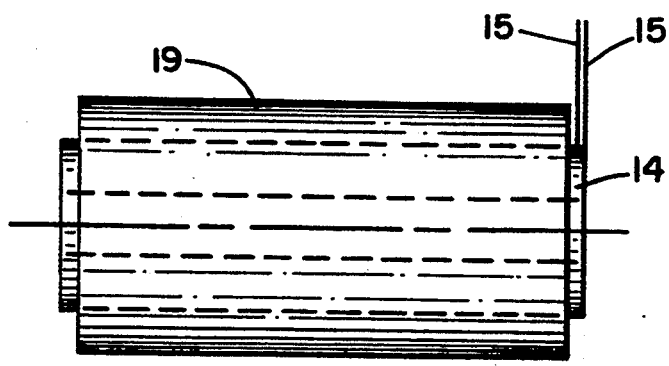
FIGS. 3 and 4 are side plan and end views, respectively, of an assembly of a permanent magnet, coil and Terfenol-D rod actuator according to the present invention.
Figure 4:
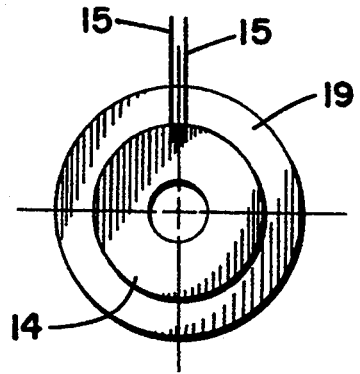

The presently preferred core of the shaker 10, based on cost and availability, is a PM-50A Terfenol-D actuator, purchased from EDGE Technologies of Ames, Iowa, with both ends free. The actuator consists of a 2.020" long by ¼" diameter Terfenol-D rod, two 1040 steel end caps, and a wound wire solenoid epoxied inside the bore of an Alnico-V cylindrical permanent magnet. The permanent magnet provides that the shaker is magnetically biased (enabling the Terfenol to operate in the "linear" region) without the need to run a direct current (DC) through the coil. (Any current in the coil would add to the waste heat). The permanent magnet/coil assembly is shown in FIGS. 3 and 4. The PM-50A forms the basis about which the balance of the shaker 10 is designed. Terfenol-D includes terbium, iron and dysprosium. Different proportions of these components in the Terfenol-D yield different properties. While Terfenol-D is currently the preferred magnetostrictive material for use in the present invention due to its availability and cost, it is believed that other magnetostrictive materials now known or later developed may be substituted without sacrificing the advantages of the present invention.

It shall be understood that the PM-50A rod is used in the ¼" design of the present invention. Other customized models can be used for larger or even smaller sized systems, and it shall be further understood that all the shakers of the present invention may be scaled up or down. In fact, the advantages of the magnetic circuit of the present invention are believed to be more important as the diameter of the Terfenol-D rod increases, particularly for systems using rod with a diameter of greater than one half (½) inch.

Figure 5C:
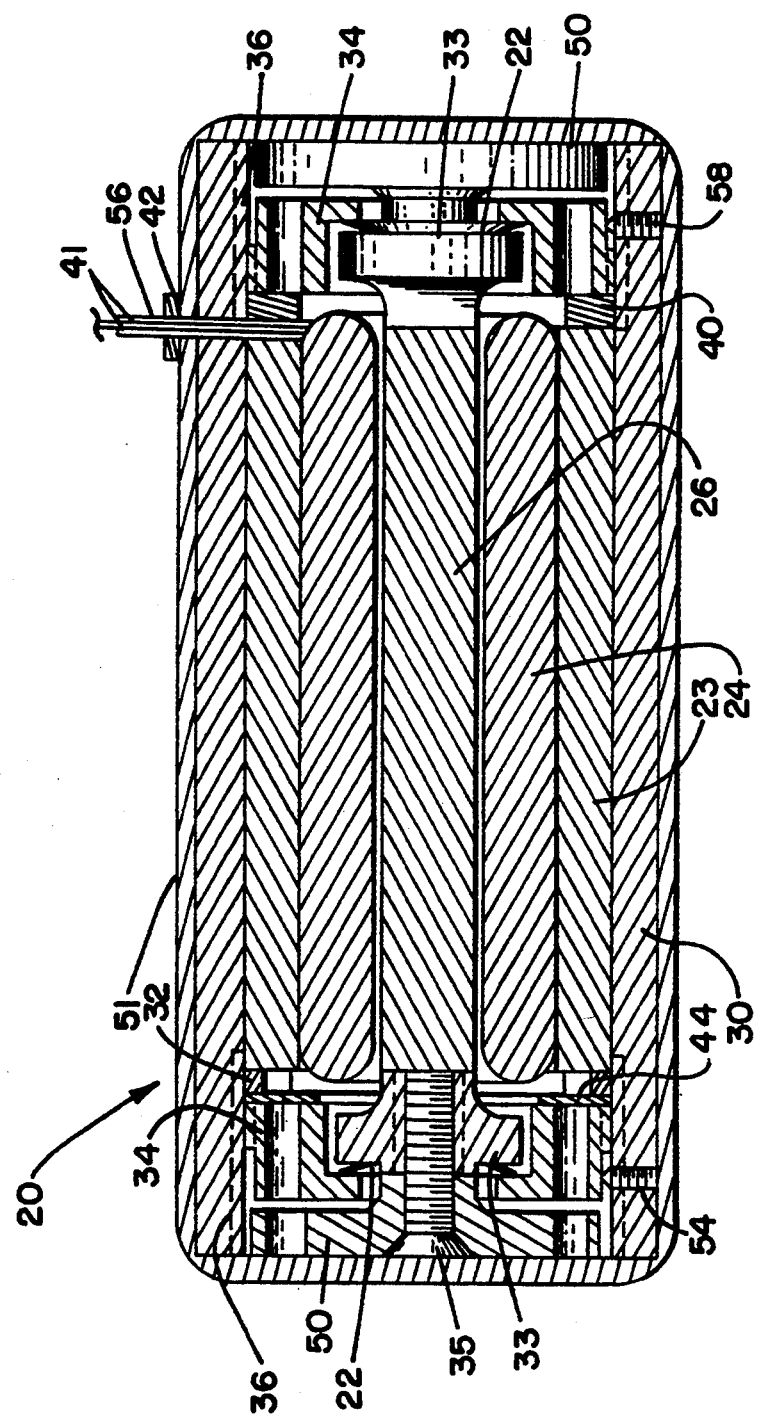
FIG. 5c is an enlarged longitudinal cross-sectional view taken along the lines 5b–5b of FIG. 5a of the shaker according to the present invention.

An implantable embodiment 20 of the present invention is shown in FIGS. 5a and 5b. Embodiment 20 is designed to be implanted in an animal body (and in particular, a calf). For this application, overall volume of the shaker 20 was kept to a minimum; the smaller the better as far as the recipient's body was concerned. FIGS. 5a and 5b show the shaker 20 to scale. FIGS. 5b and 5c show cross-sectional views taken along the lines 5b-5b of FIG. 5a, with 5c being an enlarged view.

The PM-50A parts retained in the design of shaker 20 are the cylindrical permanent magnet 23, the "wound coil" or solenoid 24, and the ¼"×2" Terfenol-D rod 26 (of which the length and geometric tolerances were altered). The balance of the parts are of original design.

The outside diameter of the permanent magnet 23 implies the inside diameter of the shaker housing 30, which is made of stainless steel. Stainless steel offers good corrosion resistance, is readily available, magnetically almost neutral, and a lot less expensive than titanium (the material of preference for implants). The magnetically neutral housing prevents the flux path from being diverted away from the Terfenol-D rod 26. The housing was designed to be fabricated from standard ⅛" wall, 1" inside diameter 303 stainless steel tubing. Stainless steel is believed to be preferably to Aluminum due to its greater stiffness, providing for a higher resonant frequency.

Figure 7:
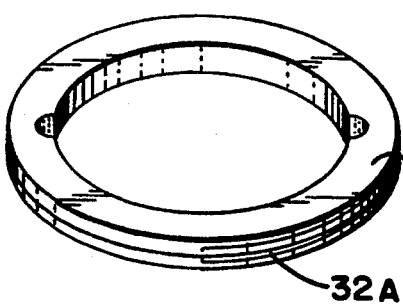
FIG. 7 is a perspective view of the magnet lock of the shaker according to the present invention.
Figure 8:
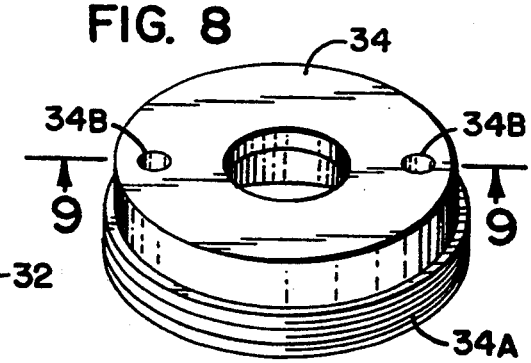
FIG. 8 is a perspective view of the spring seat/adjuster of the shaker according to the present invention.
Figure 9:
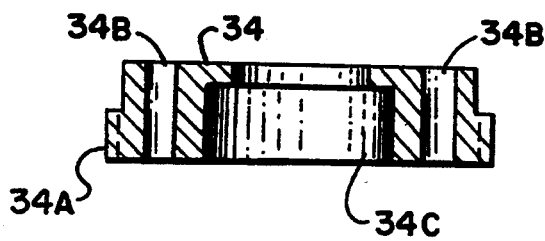
FIG. 9 is a cross-sectional view of the spring seat/adjuster of the shaker according to the present invention.
Figure 10:
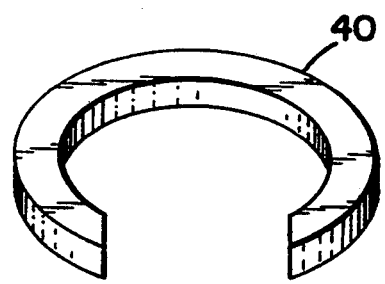
FIG. 10 is a perspective view of the right hand shim of the shaker according to the present invention.

The permanent magnet/coil assembly (FIG. 3 and 4) is positioned and secured in the housing 30 (FIG. 6) by a magnet lock 32 (FIG. 7), on the left hand (as arbitrarily defined for the purposes of this description) side (the end opposite the leads), and the right hand side spring seat/adjuster 34 (FIG. 8 and 9). The magnet lock 32 is formed from an 0.082 thick 1045 steel flat washer with threads (32a) cut on its outer diameter, and is threaded into threads 36 on the inside of housing 30. The spring seat/adjuster 34 (FIGS. 8 and 9) is also threaded (34a) on its outside diameter. It includes a pair of through-holes 34b, and a terraced inside opening 34c. Between the magnet lock 32 and the right-hand spring seat/adjuster 34 is a "C" shaped 1045 steel shim 40 (FIG. 10), or "RH Shim," to allow the electrical solenoid leads to exit the solenoid and pass through the housing via exit hole 42 of housing 30 without being damaged by the spring seat/adjuster 34. The shim 40 also provides a flat surface against which the right-hand adjuster 34 can seat, which helps preserve alignment of the internal parts of the shaker and improves the magnetic circuit.

The inside diameter of the housing implies the smallest pitch diameter thread acceptable for the spring seat/adjusters 34 and the magnet lock 32, in this case, 1⅛" thread. Small changes in relative location of the spring seat/adjusters 34 meant large changes in the resulting spring washer preload of the Terfenol-D; something like 1230 N/mm (Newtons per millimeter). A fastener with more threads per inch would, therefore, provide better control over the pre-stress. This was the rationale used to justify specification of 1⅛-28 UN-2 thread (1⅛=pitch diameter, 28=threads per inch, UN=unified thread form, 2=class 2 fit which specifies tolerances of the thread).

Twenty-eight threads per inch is not a standard (i.e. popular), pitch in 1⅛" diameter fasteners. It is, however, available, as are Class 2 fits. The class of fit was specified to reduce the uncertainties in relative location of the housing and the spring seat/adjusters 34. Specifically, it was planned that the thread would accurately locate the center of the spring seat/adjusters 34 with the center of the housing 30. The centers needed to coincide in order to prevent the spring bases from contacting the insides of the spring seat/adjusters., i.e., tolerances were chosen and part dimensions specified assuming a class 2 fit of the threads.

However, even the above-specified threads and fit are relatively "sloppy" resulting in excessive play and causing the spring seat/adjuster on the left hand side to tip in relation to the housing (especially when the set screws were tightened). The tipping caused uneven loading, binding, unwanted damping, and a loss of physical symmetry and therefore acceleration output symmetry (from end to end) of the shaker. Therefore, brass shims 44, for the left hand spring seat/adjuster 34, are used to provide the adjuster 34 with a flat and rigid surface against which it can seat. Preferably, the shims 44 are 1.08" outside diameter, 0.54" inside diameter, 0.001" thickness. The thickness of the shims are chosen to result in the proper installed height of the spring washers 22 and thus the desired preload of the Terfenol-D rod.

Figure 11:
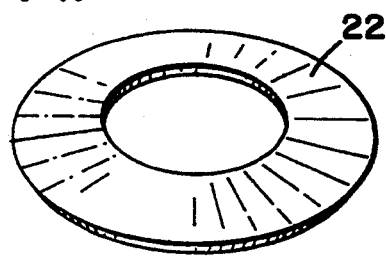
FIG. 11 is a perspective view of the spring washer of the shaker according to the present invention.

The spring washers 22, shown in more detail in FIG. 11, were chosen from a combination of their dimensions, load capacity, and availability. Belleville, B0500-018, 1074 spring steel washers were used. They were ½"

outside diameter, ¼" inside diameter, 0.018" material thickness, and about 0.030" tall. The actual dimensions of the spring washer depends not only on manufacturing tolerances, but on installed height. Decreasing the installed height increases the inside diameter and decreases the outside diameter. The outer diameter of the spring bases were reduced by approximately 0.030" (from the originally specified dimensions) to eliminate incidental contact with the bore of spring seat/adjusters 34.

Figure 12:
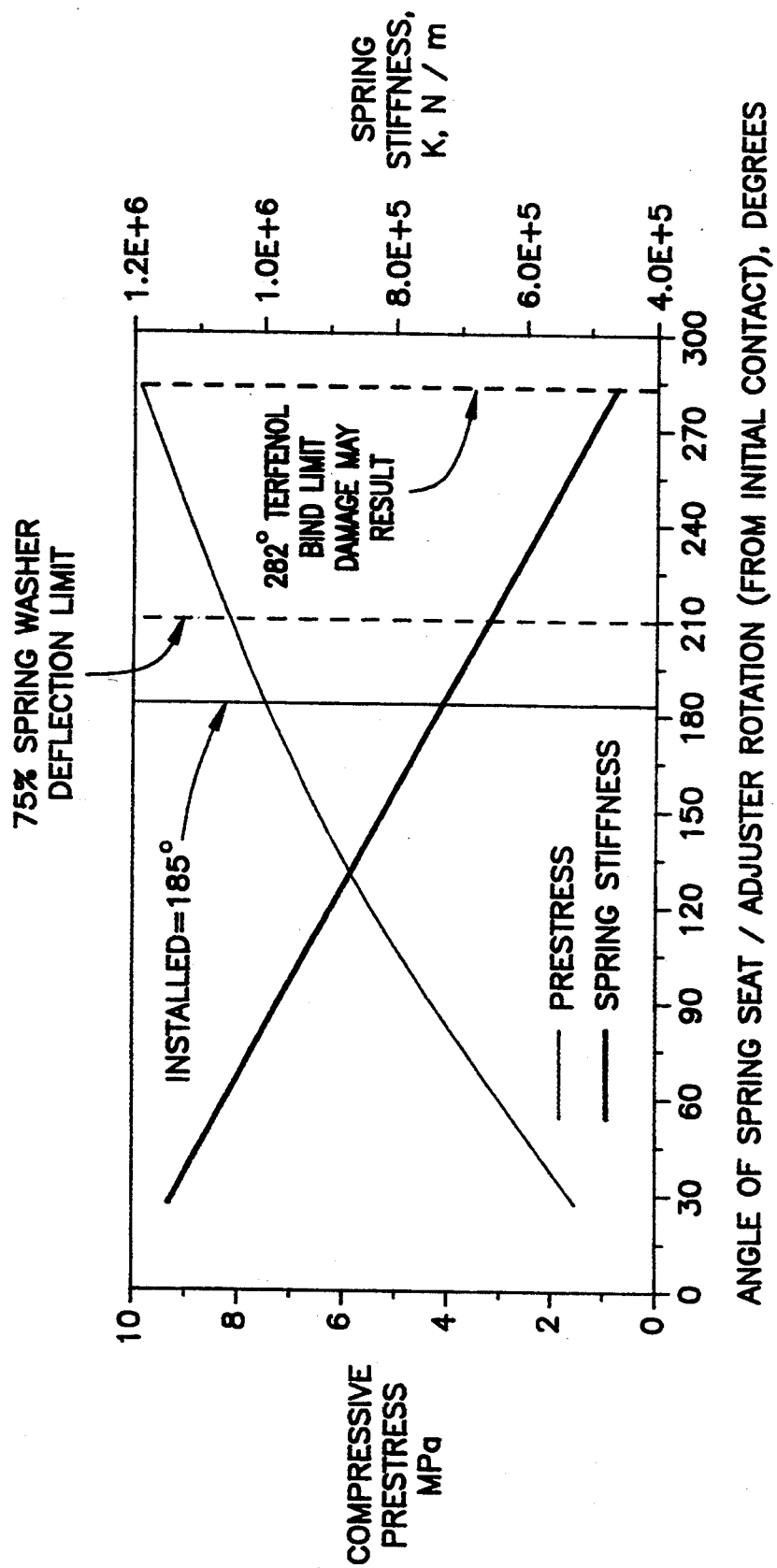
FIG. 12 is plot of compressive pre-stress and spring washer stiffness versus angle of spring seat/adjuster for the shaker according to the present invention.

Compressive pre-stress of the Terfenol-D rod and the stiffness of spring washer 22 are a function of the installed height of the spring washers 22. Both quantities can be estimated by measuring the angle of left hand spring seat/adjuster rotation after initial contact with the spring washer. The data displayed in FIG. 12 was calculated assuming 28 threads per inch and a total of two spring washers, one on each end. The manufacturer recommends operation of the spring washers below the 75% deflection limit shown in the figure. Operation above this limit may result in unpredictable spring washer seating. The absolute maximum angle of rotation is also shown in the figure. Exceeding this limit will bind the Terfenol-D rod 26, i.e., the spring washers will be flat. The shaker was assembled with approximately 185° rotation which resulted in a compressive pre-stress of 7.6 MPa and a spring washer stiffness of 730 kN/m.

The manufacturer, Belleville, recommends that the surfaces which come in contact with the spring washers should be a minimum hardness of Rockwell C48. This hardness reduced surface wear or damage, thus helping to maintain the original installation dimensions. For this design, the surfaces in contact with the spring washers are the tops of the spring bases and the ends of the bores in the spring seat/adjusters 34. 1045 carbon steel was chosen as the material for these parts in the embodiment 20 because it could be easily machined, is readily available, has an endurance limit (in excess of 200 MPa), is inexpensive, and its surfaces can be easily flame-hardened to RC 48.

Figure 13:
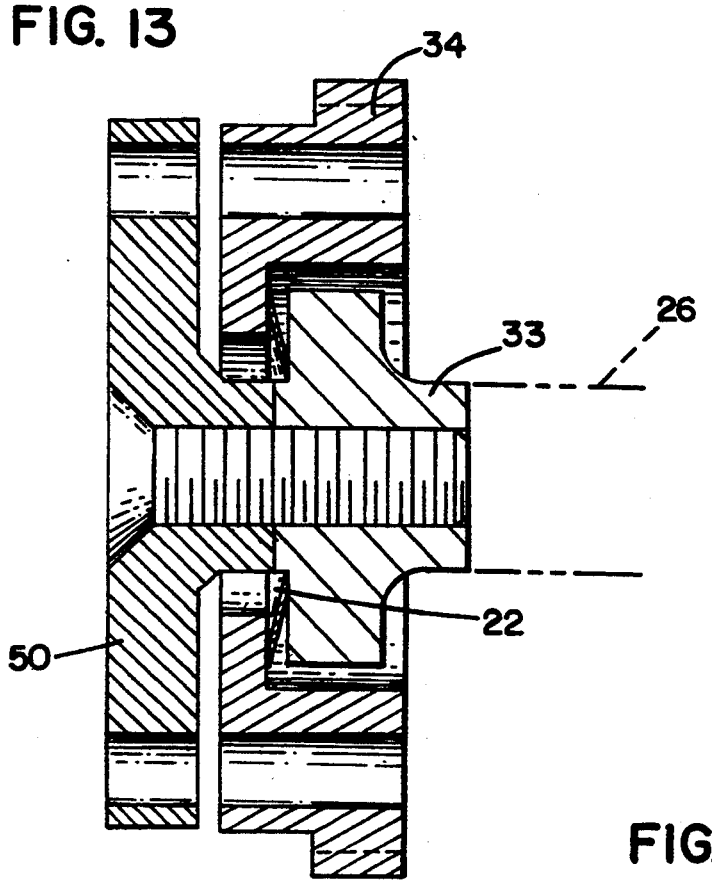
FIG. 13 is a cross-sectional view of the section assembly of vibrating mass, spring seat/adjuster and spring seat of the left-hand side of the shaker according to the present invention.
Figure 14:
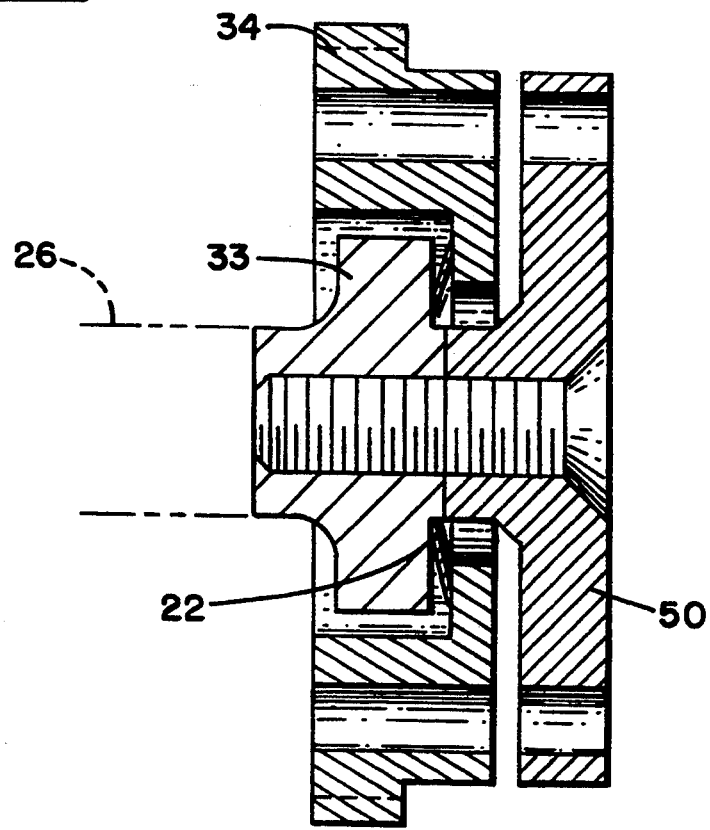
FIG. 14 is a cross-sectional view of the section assembly of vibrating mass, spring seat/adjuster and spring seat of the right-hand side of the shaker according to the present invention.
Figure 26:
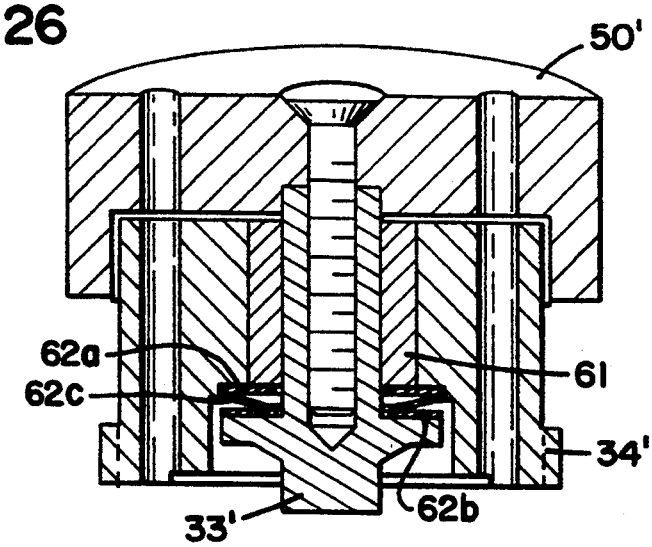
FIG. 26 is a cross-sectional view of the assembly of the extended vibrating mass, extended spring seat/adjuster, bushing and extended spring base of the alternate embodiment 60 of the shaker according to the present invention.

A better choice may be 1010 steel and a design change to incorporate hardened steel flat washers to be in contact with the spring washers (shown in FIG. 26 with respect to embodiment 60 discussed below). The 1010 steel is preferable mainly from a magnetic circuit point of view. Compared to 1045 steel, 1010 is extremely permeable and exhibits less magnetic hysteresis. The disadvantage of this proposed design change includes an increase in shaker length (approximately ⅛") and there is no known source for hardened steel flat washers of acceptable dimensions. The section assembly of the left-hand vibrating mass 50, spring seat adjuster 34, spring washer 22, and spring seat, or base, 33 is shown in FIG. 13. The corresponding section assembly for the right-hand is shown in FIG. 14.

Figure 15:
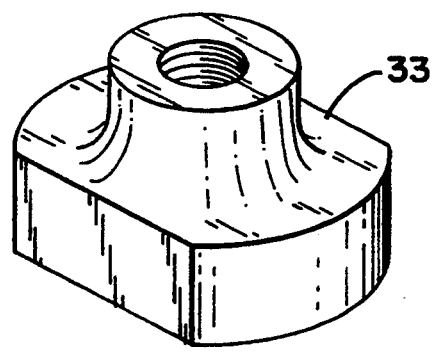
FIG. 15 is a perspective view of the spring base of the shaker according to the present invention.

In the prototype of system 20, the spring bases 33 (FIG. 15) and spring seat/adjusters 34 were inadvertently through-hardened (at the machine shop) when fabricated. Hardening typically reduces the magnetic permeability of the steel and these parts formed an integral link in the magnetic circuit of the shaker. As a result, they were fully annealed, then the surfaces which came in contact with the spring washers were flame hardened. The surface-hardened parts should have resulted in less damage to the magnetic circuit than would have the through-hardened parts. The RH shim 40 and magnet lock 32 were also fully annealed (after through-hardening was, once again, inadvertently performed).

Figure 16A:
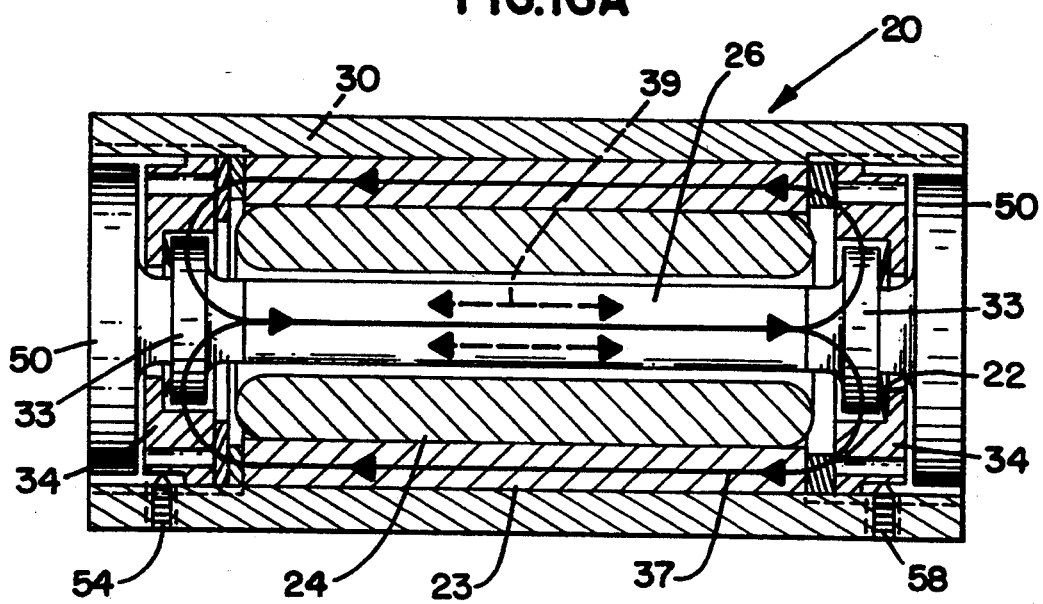
FIG. 16A is a schematic diagram of the magnetic circuit of the shaker according to the present invention.

FIG. 16A shows the magnetic circuit of the shaker 20. The solid lines 37 represent the permanent magnet 23 contribution to the field. The dashed lines 39 depict the reversible field from the solenoid 24 which either adds to, or subtracts from, the permanent magnet's field. Notice that the housing 30, being magnetically neutral, does not enter into the magnetic circuit. The only air gaps in the circuit are those from the spring seat/adjuster bores to the spring seats where there was a 0.015" radial clearance. The steel spring washers 22 actually provide a magnetic flux path from the spring seat/adjuster 34 to the spring seat. The minimization of air gap dimensions in this design represent an improvement over the standard PM-50 actuator.

Figure 16B:
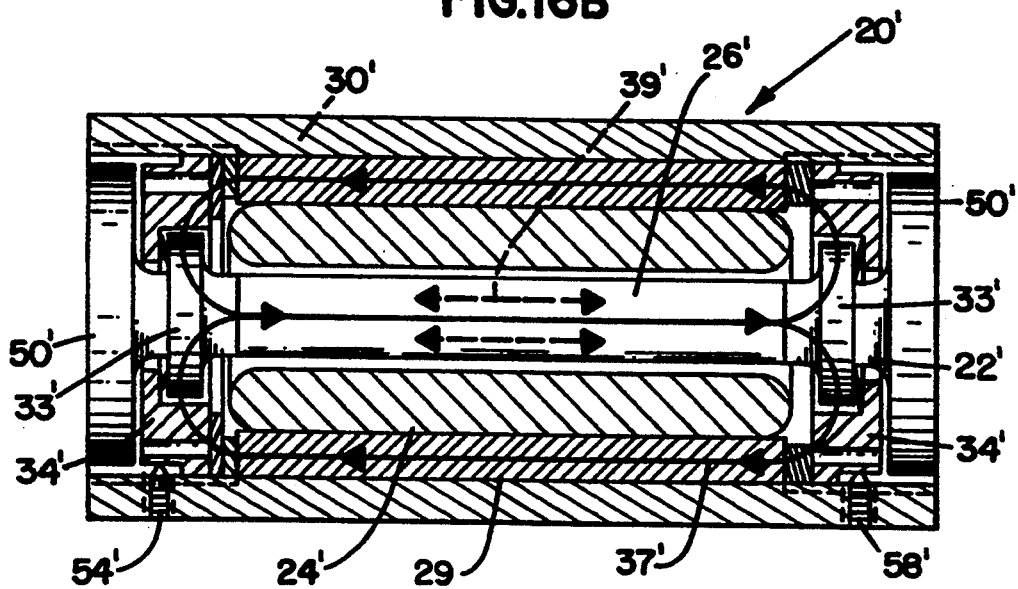
FIG. 16B is an alternate embodiment wherein the permanent magnet is replaced with steel.

An alternate embodiment 20' is shown in FIG. 16B. In shaker 20', permanent magnet 23 is replaced with steel 29, and the steady-state magnetic bias on the rod 26' is provided by applying a direct current (DC) to the coil 24'. An alternating current is then applied on top of the DC bias to provide for a varying magnetic field.

Figure 17:
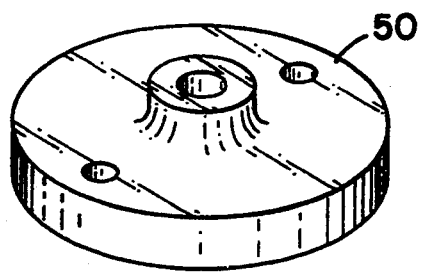
FIG. 17 is a perspective view of the vibrating mass of the shaker according to the present invention.

The shaker, when assembled, was coated with Biomer ® by the Artificial Heart Research Laboratory at the University of Utah. This did not represent a problem for the stainless steel housing, especially since the quality of the Biomer ®-steel bond was not critical. The bond between the vibrating masses and the Biomer ® coating, however, had to be excellent. If the coating debonded from the masses, unpredictable vibrations would be transmitted to the surrounding tissue. To reduce the possibility of debonding, the vibrating masses 50 (FIG. 17) were made of Isoplast 301 (a "hard" plastic) which is known to bond well with Biomer ®. Isoplast was also preferable because it was less dense than steel, resulting in less mass for the Terfenol-D to push against. Lower mass means less power would be consumed operating the shaker for a given output acceleration level. This means less waste heat will be generated, higher peak accelerations would be possible, lower electrical power consumption, etc.

To assemble shaker 20, the spring washer is positioned over the outward facing step of the spring base. The spring seat/adjuster is placed over the spring washer 22/spring base 33. The vibrating mass 50 is installed through spring seat/adjuster 34 and against spring base 33. A 4–40×0.460" hex socket flat countersunk head cap screw 35 is slid through vibrating mass 50 and thread into the spring base 33. Thread locking solution is preferably used. The cap screw is then tightened. The spring base 33 can be prevented from rotating while tightening the cap screw 35 by grasping it with needle-nose pliers across the flats.

The cap screw 35 must not extend beyond the end of the spring base 33. If it does, the Terfenol-D rod will be destroyed. Also, the surface of the spring base 33 that will come in contact with the Terfenol-D rod 26 must be free of irregularities that may damage the rod.

The permanent magnet/coil/rod assembly is then centered in housing. The coil is oriented so the leads are by the exit hole 42 (¼" dia.) of the housing 30. The leads are fed through exit hole 42. Three-foot, 22 gage, lead extensions (not shown) are soldered to the short, 26 gage, wires from the coil 24. A tygon tube sheath 56 is slid over the leads and inserted through the exit hole 42 in housing 30 until end of the sheath 56 is approximately even with the inside of the magnet and the outside of the wound coil. The magnet lock 32 is thread into the left-hand end of housing 30 and positioned so the right-hand end of the magnet 23 is 0.500" from end of housing. The RH shim 40 is inserted so the sheath 56 is centered in the ⅛" slot of the "C" shaped shim. The right-hand vibrating mass/spring/seat/adjuster assembly is installed and lightly snugged down against RH shim 40. During this process the sheath 56 will be compressed between the adjuster 34 and the magnet 23. The two set screws 58 are installed (one not shown FIG. 5) against the right-hand adjuster 34. The magnet lock 32 is tightened. Six 0.001" thick left-hand brass shims 44 are inserted. The left-hand mass/spring/seat/adjuster 34 assembly is threaded into housing 30. The adjuster 34 is tightened until the spring base 33 comes into contact with the Terfenol-D rod 26. This is the reference position from which the pre-stress is estimated. The assembly is then tightened against the shims 44. The spring seat/adjuster 34 should not exceed 210 degrees of rotation. Adjustment beyond this value may bind the Terfenol-D rod and damage it. Tightening should result in approximately 185 degrees of rotation. If not, one shim should be removed to increase the rotation or another inserted to decrease the rotation. When finished adjusting the number of shims 44, the left-hand set screws 58 are snugged against spring seat/adjuster 34.

Once assembled, the entire unit is remagnetized via an "instantaneous" 3000+ Oersted field.

Figure 18:
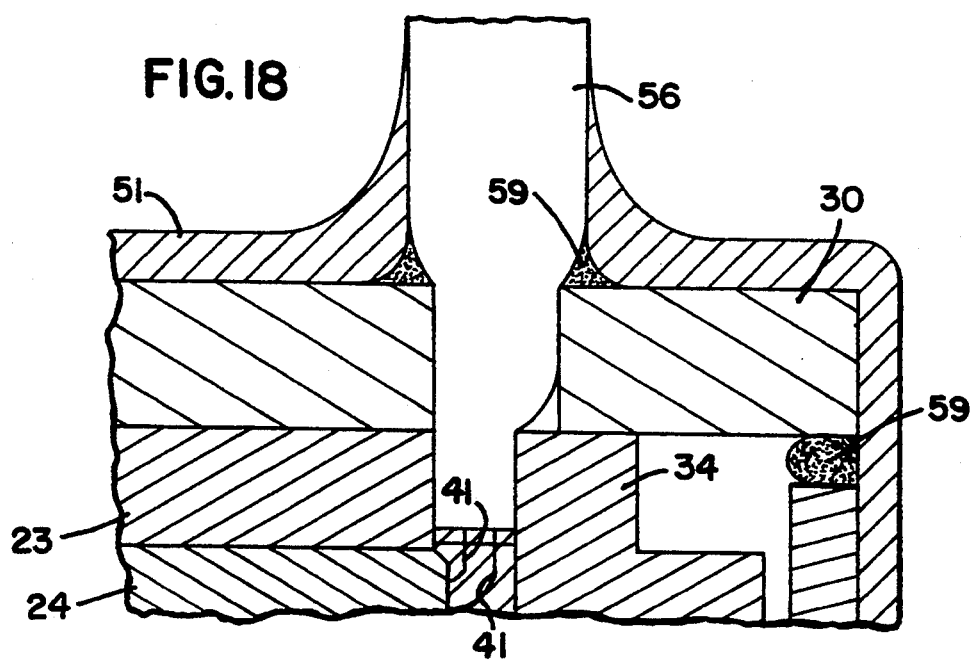
FIG. 18 is a cross-sectional, detailed view of the sealing scheme and lead attachment for the shaker according the present invention.

FIG. 18 is a section detail showing the sealing scheme employed in shaker 20. Silicone beads 59 are applied to the assembled shaker. The Biomer ® coating 51 is then applied. Biomer ® will not bond with silicone. Therefore, the silicone bead between the vibrating masses 50 and the steel housing 30 results in annular regions of Biomer ® coating 51 that are not bonded. These regions are free to deform and allow for movement between the vibrating masses 50 and the housing (the masses moved above ±0.00") without excessively straining any bonds.

The sealing scheme shown in FIG. 18 is specifically designed for implantable shakers. If it is desired to seal the shaker for underwater use, or for use in another enviornment in which a seal is desireable, less costly waterproof sealing materials can be used.

FIG. 18 also demonstrates the lead securing mechanism. The wire leads were run inside a tygon tubing sheath 56 (tygon tubing is used extensively in implants). The end outside the body in which the device is implanted is attached to a male BNC connector. The shaker end is inserted through the stainless steel housing 30 until the end of the tubing is about even with the outside of the coil 24. The leads run through the opening in the "C" shaped RH shim 40 (as shown). During assembly, the tubing is then compressed between the cylindrical permanent magnet 23 and the spring seat/adjuster 34. Biomer ® bonds with the tygon tubing 56 and provides some reinforcement for the leads 41.

It is noted that if the threading fits between the housing and the spring seat/adjuster 34 are not class 2, binding and non-symmetrical damping and vibration spectra can result. Inexact spring washer dimensions also can result in non-symmetries in the assembled shaker 20.

The maximum stress estimates for the materials used in the shaker 20 fabrication were based on the observation that the least attractive section of the shaker, from a stress and strain point of view, was the spring seat/adjuster 34.

The spring seating surface was flame hardened. However, since the material is only about 1/16" thick in this area, the entire annular ring is very likely hardened in this process. Hardening metal typically degrades its fatigue characteristics which is topical because this piece is subjected to the cyclic forces of the spring washers. In addition, "sharp" corners should be avoided owing to their stress concentrating tendencies. To decrease the likelihood of failure for the adjustor 34 a radius was specified for the corner (as opposed to a machinist cutting it with a "nice sharp" tool). Also, for this area the applied stresses are limited to approximately 6 MPa with a cyclic amplitude of about 0.3 MPa. As mentioned previously, the endurance limit of 1045 steel is in excess of 200 MPa. Applied stresses of less than five percent of the endurance limit should provide adequate life for the parts.

For the Tektronix Instrument Program plots that follow, the acceleration from the shaker 20 will be labeled "A xducer," the input voltage, "V xduc in," and the current, "I xducer." These labels can be found below the lower right hand corner of each plot.

Figure 19A:
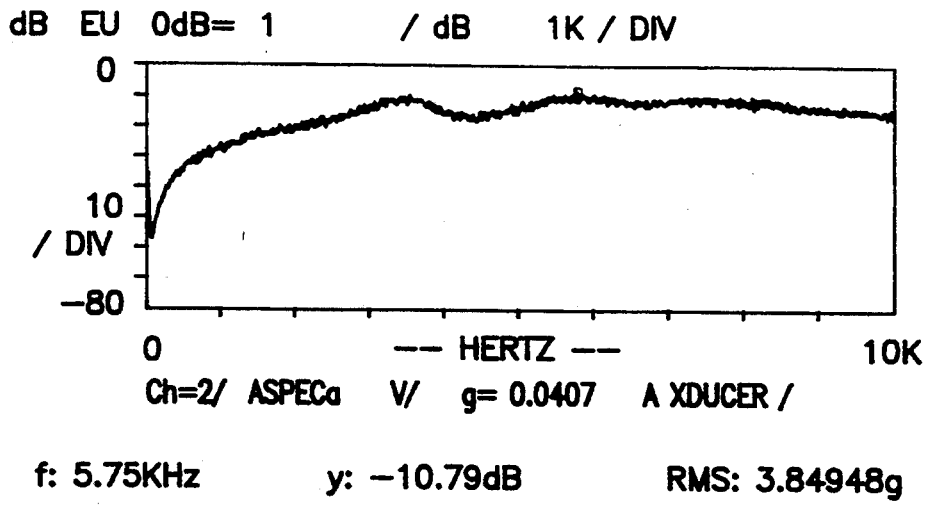
FIGS. 19A and 19B are plots of shaker output and input autospectral densities for the shaker according to the present invention.
Figure 19B:
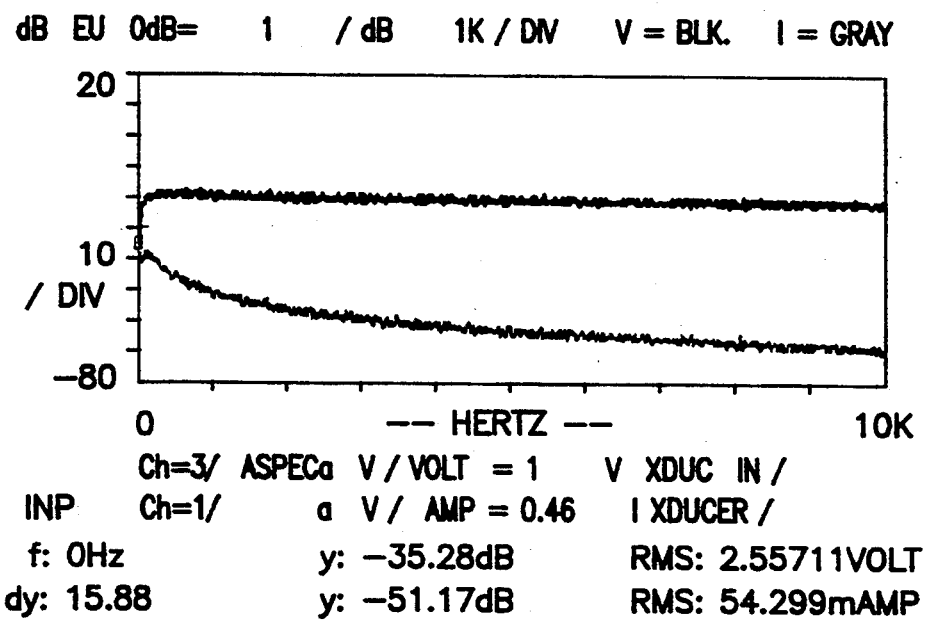

FIG. 19 shows the shaker 20 output acceleration and the input voltage and current autospectral density functions ("ASPECa") when the shaker as run by a standard audio amplifier. The upper plot is the acceleration output (ordinate) of the shaker as a function of frequency (abscissa). The amplifier settings were adjusted to give an approximately flat voltage autospectrum (lower plot, black line). In this case the voltage signal was broad band pseudo-random noise provided by the Tektronix's internal signal generator. As shown in the lower plot, the current amplitude (gray line) decreased with increasing frequency. This trend is expected; the impedance of an air core inductor (solenoid) increases linearly with frequency as $\|Z\| = 2\pi f L$. (See "Terfenol-D Notes, Vol. 4, No. 1, page 4, Edge Tech., Jan. 1991)

Figure 20A:
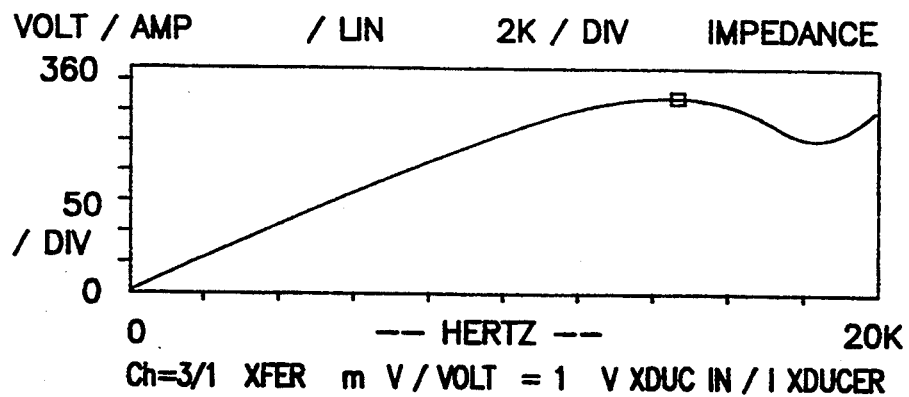
FIGS. 20A and 20B are plots of electrical impedance magnitude of the shaker and coherence for the shaker according to the present invention.
Figure 20B:
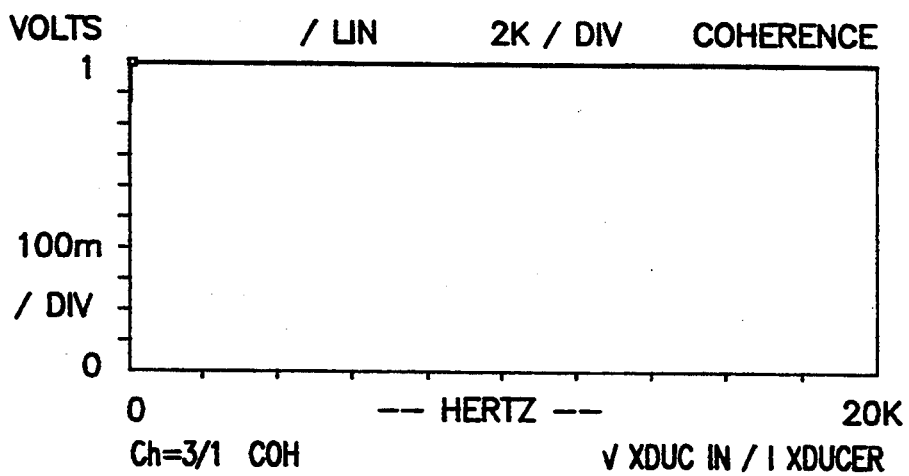

As shown in FIG. 20, the linear impedance assumption is not a very good one for an inductor with a magnetostrictive core. The upper plot, "Ch=3/1 XFER m," is the magnitude of the shaker's electrical impedance as a function of frequency (from 0–20 kHz). XFER is the frequency response function (FRF), H(f), if one considers the current the system input, A(f), and the voltage the output, B(f). (XFER stands for transfer function, a common, though inaccurate name for the frequency response function.) The lower plot is the coherence, "COH," for the measurement. Recall that a coherence value "near" one is indicative of linearity (in the least squares sense) and the quality of the measurement. As shown, the XFER function calculation resulted in an excellent coherence function (COH>0.98 for $f \geq 12.5$ Hz).

The eddy current critical frequency for a ¼" diameter Terfenol-D rod was reported to be approximately 1700 Hz (Butler, J. L., "Application Manual for the Design of Etrema Terfenol-D Magnetostrictive Transducers," Etrema Division, Edge Technologies, Inc., 1988). Above that frequency losses in transduction efficiency due to eddy currents within the rod were supposed to yield substantially reduced Terfenol-D response. Couple that with the increasing difficulty of passing "higher" frequency currents through the solenoid, i.e., $\|Z\| \to \infty$, and one would expect the acceleration output of the shaker to diminish rapidly with increasing frequency. As shown in FIG. 19, that was simply not the case. The acceleration amplitude shows "peaks" at 3500, about 6000, and again at approximately 8000 Hz. Surprisingly, the acceleration autospectrum of the shaker is reasonably flat, ±10 dB, from 800 Hz through 10 kHz. The spectrum being that flat means that a standard audio frequency equalizer/booster, with adjustments of ±12 dB per band, can be used to modify the input signal to get a desired output. In essence, the frequency equalizer/booster would eliminate the need for special signal processing techniques.

The unexpected shaker performance was thought to come from three factors:

1. Improvements in magnetic circuit design (compared to the standard PM-50 actuator);
2. The increase in effective magnetic field in the outer regions of the Terfenol-D rod 26, due precisely to the induced eddy currents within the rod; and
3. The electrical impedance of the shaker 20 does not increase with frequency as rapidly as predicted by circuit theory or the manufacturer, Edge Technologies, Inc.

Figure 21:
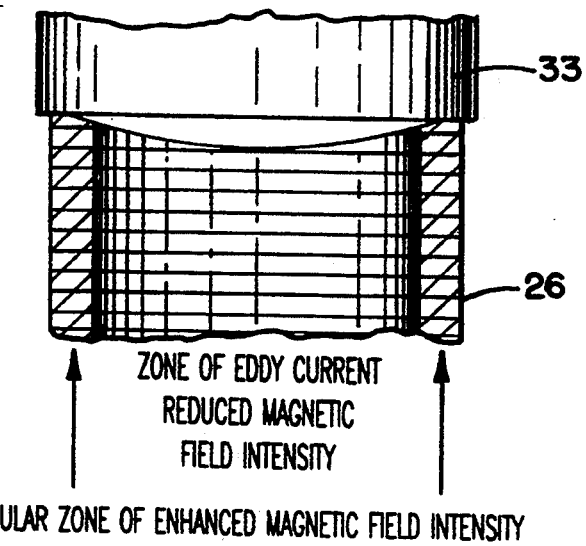
FIG. 21 is a schematic section detail of the Terfenol-D rod showing possible eddy current affects in the shaker according the present invention.

The enhanced magnetic field strength in the outer portion of the rod may result in better than expected displacements of an annular region of the rod, i.e., the outer "skin." The rod pushes against a flat surface so even an annular portion displacing would result in shaker output. This is shown schematically in FIG. 21. Of course, the resulting output force (thus accelerations) reduces owing to the reduction in material contributing to the output.

Figure 22:
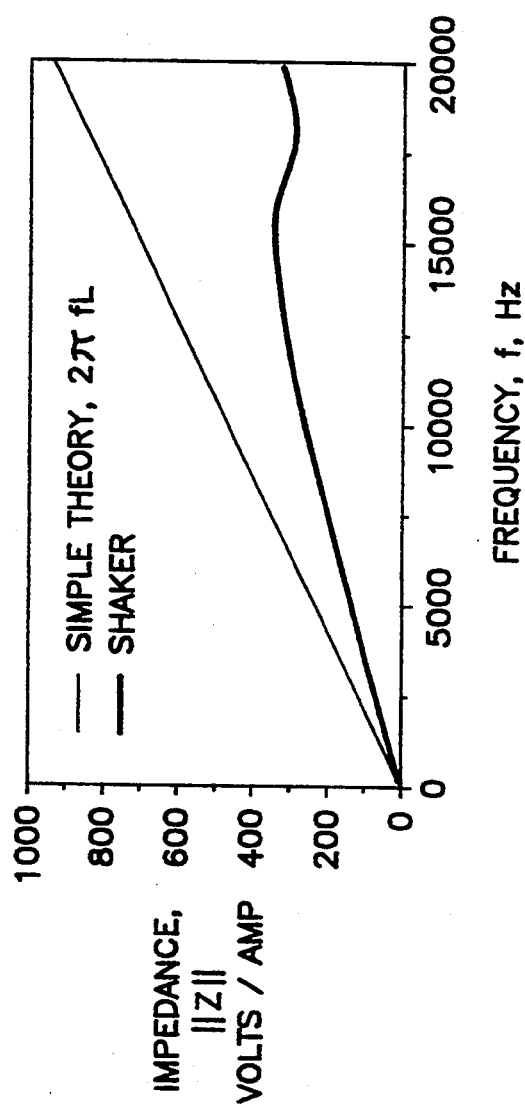
FIG. 22 is a plot of theoretical and experimental shaker inductance and impedance magnitude versus frequency for the shaker according to the present invention.

As shown in FIGS. 20 and again in FIG. 22, the shaker's impedance magnitude increases at a rate less than $2\pi fL$. That being the case, the shaker 20 has lower than expected impedance which translates to higher than expected magnetic fields within the solenoid at any given frequency. For FIG. 22 the inductance, L, was estimated by applying a step voltage to the shaker while monitoring the current as a function of time. The tests implied that the inductance of the shaker is approximately 7.4 mH (milli-Henry). The experimental data for FIG. 22 was obtained from a broad band FRF measurement (the value of the DC resistance was subtracted).

Figure 23A:
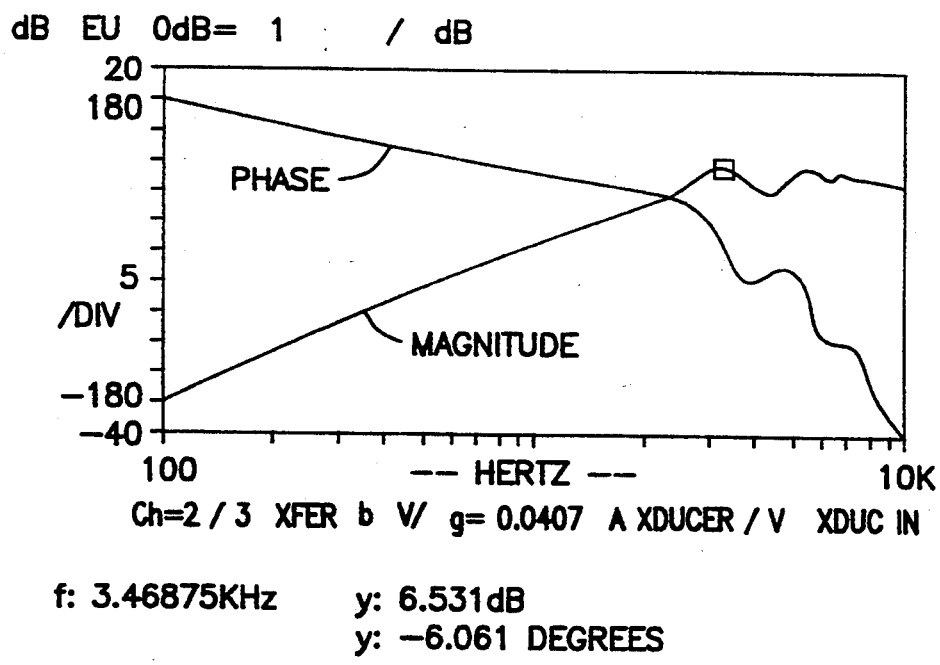
FIGS. 23A and 23B are plots of the acceleration from voltage frequency response function (FRF) and its coherence for the shaker according to the present invention.
Figure 23B:
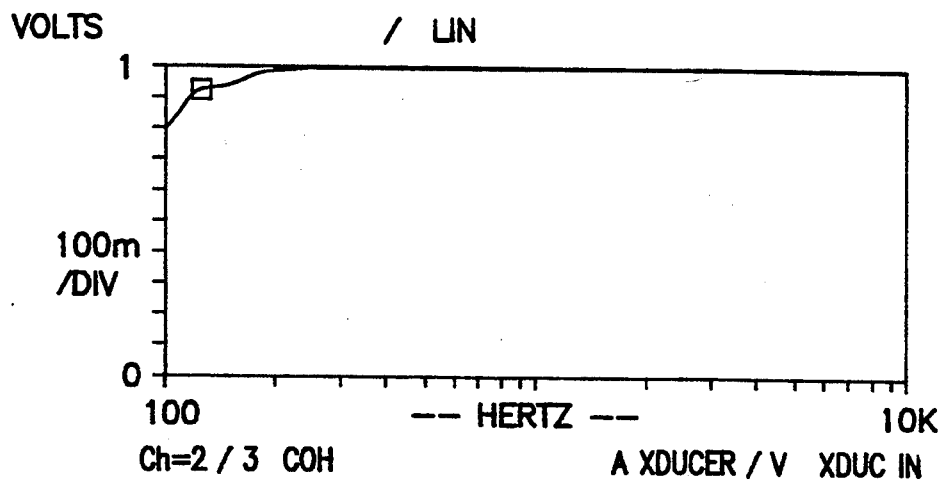

The upper plot of FIG. 23 shows the shaker's acceleration from voltage FRF in Bode plot format (dB ordinate, log abscissa). Magnitude is the black line; phase between the acceleration and applied voltage is the gray line. The lower portion of FIG. 23 is the measurement's coherence function. It shows that FRF values below about 120 Hz are suspect. This is of little concern in this study since the proposed shaker driver system has a low frequency limit of approximately 100 Hz. Therefore, the shaker need not perform well in this frequency range.

Figure 24:
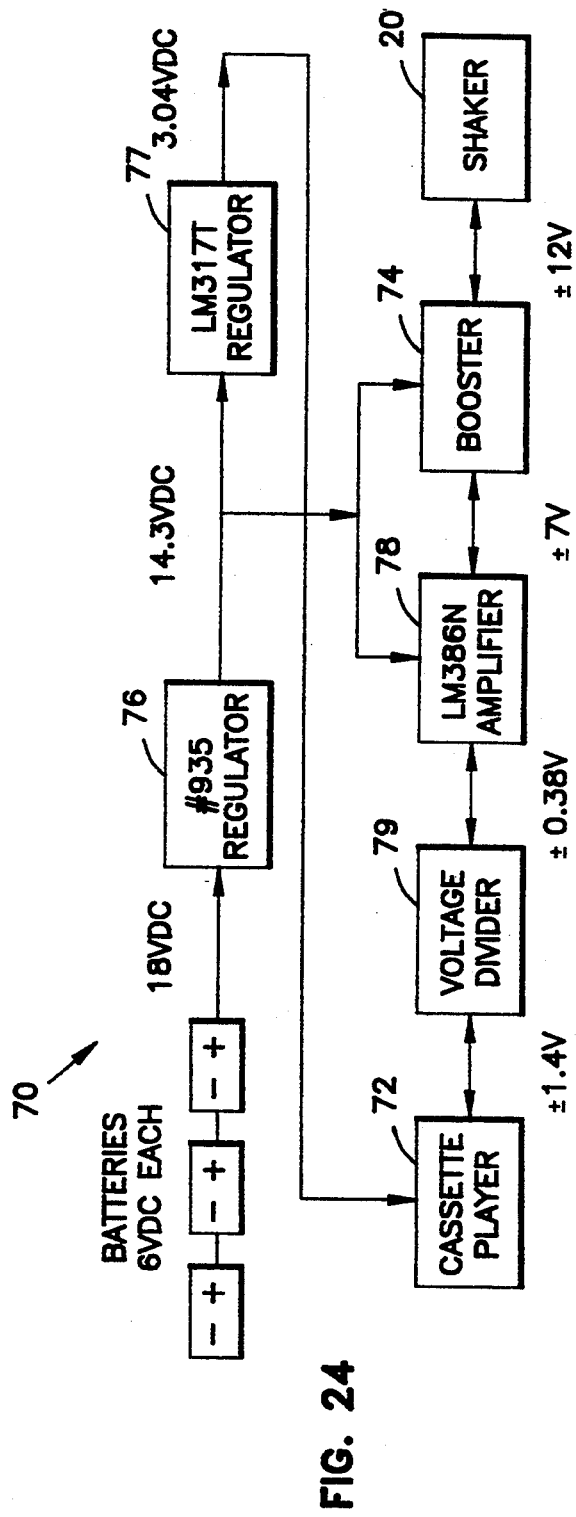
FIG. 24 is an electrical block diagram of one embodiment of the signal source used to excite the shaker according to the present invention.

The portable shaker drive system 70 has to be portable, simple to operate, small in size, lightweight, and reliable. To simulate the operation of an artificial heart, analog recordings of the voltage output from an accelerometer mounted on the operating Utah-100 artificial heart ventricle, when it was operating, were made and then played back to the shaker 20. The reliability requirement is believed to be served best by using as many off-the-shelf, proven technology items as possible. Cassette tapes, cassette players, frequency equalizer/boosters, and rechargeable batteries are all readily available. Therefore, these items form the core of the shaker drive system 70, as shown in FIG. 24.

The portable cassette player 72 chosen for the system (a Realistic brand, model PC-35 Personal Stereo Cassette Player) had a frequency response range (±6 dB) of 63 Hz to 10 kHz, which was the widest range of all of the players investigated. It had a signal to noise ratio of 60 dB (Dolby noise reduction in) with wow and flutter limited to less than one quarter of a percent. Input voltage was 3 VDC (direct current voltage). Tests showed its output was limited to ±1.4 V (with a 32 Ω load), current output was limited to 66 mA (for any load), power output was limited to 44 mW (milli-Watts), and its output impedance was 11.8±0.1 Ω. Its amplifier was class B and it is not protected.

The frequency equalizer/booster 74 is a standard automotive 40 watt stereo booster. It has a frequency response range (±3 dB) of 30 Hz to 30 kHz, five tone controls (each with a range of ±12 dB), total harmonic distortion of less than one percent, weighs less than two pounds, and requires between 10 and 14.4 VDC with a maximum of five amps current. Tests confirmed that it had an input impedance of approximately eight ohms and was capable of receiving an audio signal of ±7 V. This device also contains class B, unprotected amplifiers. The unit does not have a "volume" control: it was either "on" or "off." When on, it simply amplified the input signal by approximately four times. When off, the input was connected to the output.

The booster's output voltage was limited by the voltage of its power supply. If a 12 VDC supply is used, output voltage amplitude is limited to something less, i.e., ±10 V. With 14.3 VDC supplied, the maximum output voltage amplitude is approximately ±12 V. The batteries (mobile phone batteries) are 6 volts; three in series would yield 18 VDC. The problem with batteries, however, is that they run down; when used, the voltage drops as their power is depleted. As the voltage drops, the booster's output amplitudes also drops.

Preliminary tests indicated that a power supply of less than 12 VDC for the booster would result in output voltages insufficient to drive the shaker at the anticipated acceleration levels. Since changing the batteries every thirty minutes was considered to be unacceptable, three six-volt batteries were run in series. When fully charged they provided 18 VDC, which, of course, was too much (the cassette player needed 3 VDC while the booster required between 12 and 14.4 VDC). Therefore, it was necessary to design and build both a 3 VDC (approximately 200 mA) and a 14.4 VDC (5 A) power supply which could be run from an 18 VDC source. This was accomplished using standard (off the shelf), integrated circuit, adjustable voltage regulators. A #935 regulator 76 was used for the five amp 14.4 VDC supply; an LM317T regulator 77 was used for the 3 VDC supply. With this set-up, it was possible to run the player/booster/shaker system for three and one-half hours on a set of batteries.

The booster is capable of receiving audio input voltage amplitudes of ±7 V, while the cassette player is only capable of supplying ±1.4 V. In order to utilize the capacity of the booster, the signal from the cassette deck is amplified. This was for the best, since designing an intermediate amplifier circuit allowed for impedance matching for both the cassette player and the booster, and capacitive isolation of all components. The amplifier chosen was a standard, low power, integrated circuit audio amplifier 78, an LM386N, 400 mW. For its input side, voltage divider resistors 79 were chosen to provide both a 32 Ω impedance, to match that for which the cassette player was designed, and a reduction in voltage amplitude from ±1.4 V to ±0.38 V. The LM386N 78 was used in its standard (approximately) 20:1 amplification configuration; therefore, the maximum output voltage amplitude was ±7 V. Capacitors were chosen, preferably by the manufacturer's specifications, or if that failed, empirically.

The power supply and amplifier components are assembled on a printed circuit board which in turn is installed in a modified metal enclosure. Cables are made to allow interconnection of components, preferably everything plugs together so any item that may fail can be replaced quickly and easily. The system is also built so it can be carried by the animal in saddle bags; balance dictated that half of the mass must be on each side. Tests were performed to verify that temperature limits (for the voltage regulators, in particular) were not exceeded during operation of the system. Lower frequencies were found to be better simulated with a 50 uF capacitor installed between the shaker (280MF) and the booster.

ALTERNATE EMBODIMENTS

Electrical Drive System Modification

For non-portable or limited portability shaker systems, AC audio components (as opposed to the battery operated components) may be used in the drive system 70. Increased power and better frequency control are available from the AC audio components. For example, the shaker can be powered by a 50-watt amplifier and 12-band equalizer (used in conjunction with the personal cassette player with an AC adapter). Thermal dissipation rates will likely become the limiting factor for shaker operation in this configuration. More power translates to higher acceleration magnitudes and more waste heat. Elevated shaker surface temperatures also will result. A shaker temperature two degrees Celsius above body temperature is acceptable; higher temperatures may cause thermal damage to the surrounding tissue.

Single-Action Design; Alternate Implantable Design

The shaker 20 delivers the same vibration spectrum to two separate tissue regions (each end of the shaker). However, the design can be easily converted to a single-action (only one end moving) shaker. This change allows an approximate doubling of the acceleration amplitudes, when compared to the shaker 20 design, since the effective length of the Terfenol-D rod increases from one inch to two inches. This may allow simulation of a wider variety of artificial heart operating conditions, i.e., perhaps the higher acceleration magnitudes associated with partial-fill, full-eject operation can be simulated. (Shaker 20 is designed to simulate full-fill, full-eject ventricle operation). The single-action embodiment represents an improvement of the system since an implanted ventricle is often operated in the partial-fill, full-eject mode.

Figure 27:
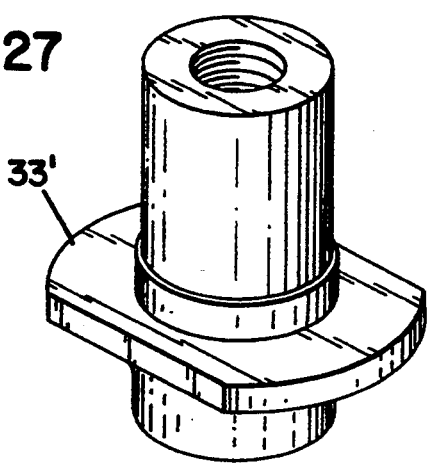
FIG. 27 is a perspective view of the extended spring base of the alternate embodiment 60 of the shaker according to the present invention.
Figure 28:
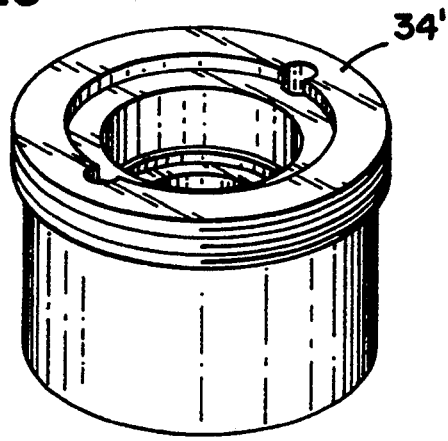
FIG. 28 is a perspective view of the extended spring seat adjustor of the alternate embodiment 60 of the shaker according to the present invention.
Figure 25:
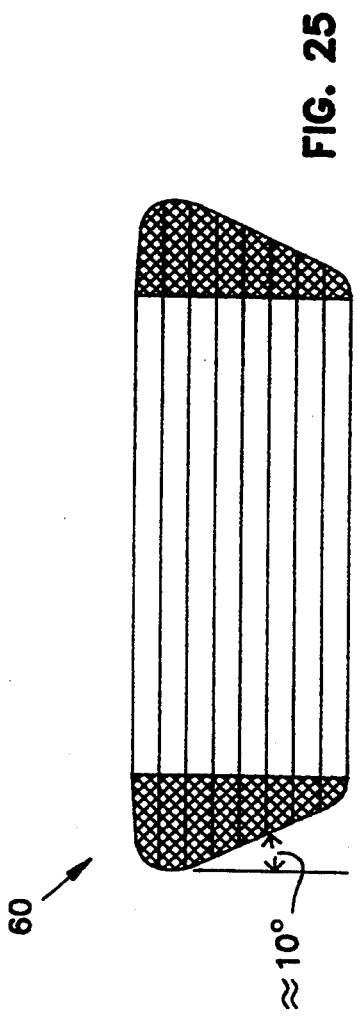
FIG. 25 is a perspective view of an alternate embodiment of the shaker according to the present invention, the alternate embodiment having extended and rounded ends.
Figure 29B:
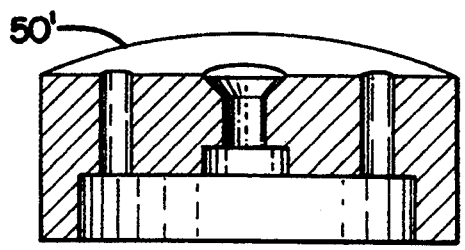
FIGS. 29A and 29B are perspective views of the extended vibrating mass of the alternate embodiment 60 of the shaker according to the present invention.
Figure 29A:
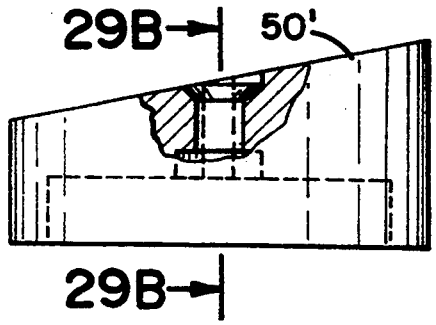

Extended, tapered, and rounded ends of shaker 20 were found to be preferable for implanting the unit in an animal. Veterinarians were concerned about "the sharp corners" of the cylindrical shaker 20; they expressed concern about tissue damage due to the corners (as the shaker was jostled during an animal's—in this case, a calf's—normal day) being far worse than damage due to vibration, thus masking any damage due to vibrations. As a result, for implantable uses it is preferable that the shaker has rounded ends. FIG. 25 shows the external dimensions preferred for this alternate embodiment 60 with rounded ends. This change increases the length of the shaker, and allows the shaker to "wedge" into the "V" formed by a calf's ribs. Each end was extended beyond the stainless steel shaker housing by approximately ⅜". They were designed with the same outside diameter as the housing, and were made from Isoplast. The free end of the extended end design is shown in FIG. 26. The extended spring base is shown in FIG. 27. The extended spring seat/adjuster is shown in FIG. 28. The extended vibrating mass is shown in FIG. 29.

Figure 30B:
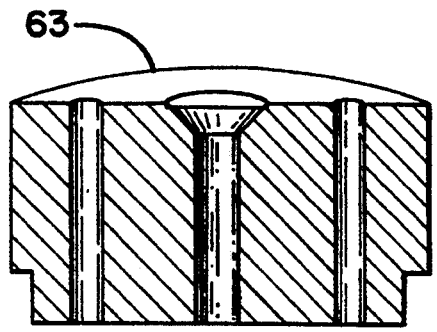
FIGS. 30A and 30B are perspective views of the extended stationary end of the alternate embodiment 60 of the shaker according to the present invention.
Figure 30A:
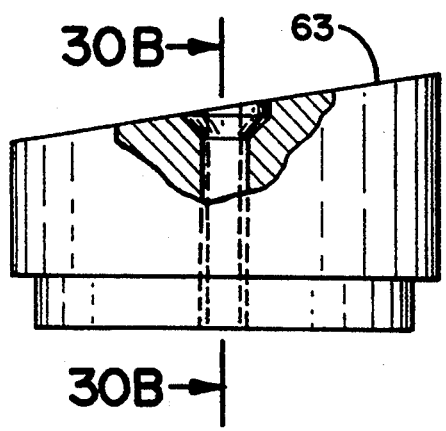

The extended design is single-action. The fixed or stationary end 63 (FIG. 30) seats flush against the end of the existing shaker housing 30; it is held there by a cap screw threaded into the old spring base. The spring washer on the fixed end was simply removed.

The new loading configuration of embodiment 60 results in a radial load, i.e., the normal force on the tapered ends resolve into an axial component and a radial component. In addition, the radial component has an effective lever-arm (of approximately 1½") with which to generate a moment. Neither a radial load or a moment applied to the spring base can be tolerated by the design of shaker 20. As shown in FIG. 26, a self-lubricating (bronze "Oilite") bushing 61 is used to support the radial load and its resulting moment. Bushing 61 maintains the spring base 33' position relative to the Terfenol-D rod 26 and spring seat adjuster 34'. It also allows radial loads and moments to be applied to the shaker without damage to the Terfenol-D rod 26 or incidental contact in the annular air gap between the spring seat/adjuster 34' and base 33' in embodiment 60. Also shown in FIG. 26 are two hardened flat washers 62a and 62b and a Belleville spring washer 62c mounted as shown with respect to the embodiment 20. The hardened flat washers are used instead of flame-hardening those surfaces which are in contact with the spring washer, which reduce the deleterious effects of material hardening to the magnetic circuit. In addition, this allows for the choice of 1010 steel for the spring base 33' and spring seat/adjuster 34', for better magnetic performance.

The embodiment 60 also allows the radial clearance between the spring base and the spring seat/adjuster to be reduced to as little as 0.010". Moreover, the permeability of 1010 steel is approximately twice that of hardened 1040 steel, improving the magnetic circuit. Overall, the changes shown with respect to embodiment 60 improve the magnetic circuit of the shaker and result in better shaker performance.

The extended version shaker 60 is easier to seal since the new sealing surfaces, between the new "extended" ends and the housing, are flat. The double-action first embodiment 20 uses silicone between the vibrating mass and a threaded surface of the housing; less than an ideal arrangement. Threaded surfaces are uneven on both a large geometric scale (they are threads) and a small scale, i.e., they feature "sharp" corners which are difficult to fill or cover with sealant. Thus, embodiment 20 is known to leak.

Modification to the rounded surfaces of the free ends of version 60 could include replacement with surfaces of customized profile. The stationary free end surface should provide an appropriate surface for placement and/or attachment of the general purpose shaker on surfaces of varied shapes. Such shapes would include a flat surface which could be used on benchtops and tie-downs embedded in lab floors. The moving fee end surface should provide a means for coupling of the test structure to the shaker; this would typically involve the use of threaded bore, as in embodiment 80 of FIG. 34.

The use of Terfenol-D as a vibration source is proven by the present invention. The shakers 10, 20 and 60 are capable of reliably and predictably producing vibrations from 120 Hz through 10 kHz (and higher). Minor design changes in the housing would convert the "extended" version 60 of the shaker into a general vibration source suitable for use in laboratory vibration testing for frequencies between approximately 100 Hz and 10 kHz.

SIMULATION OF ARTIFICIAL HEART VIBRATION

The shaker system 20 met the criteria to be used for approximating the vibration spectra of the Utah-100 artificial heart ventricle (for the chosen operating conditions of full-fill, full-eject modes). The ventricle vibrations chosen for simulation were a compromise between those which may be seen when the ventricle is implanted and those the shaker system was capable of simulating. The results presented were for shaker 20 simulation of the ventricle when operated at 60 BPM (beats per minute), 110/70, and in full-fill, full-eject modes. The increased ventricle acceleration levels associated with, for example, 80 BPM, 120/80, and full-fill, full-eject, were beyond the capabilities of the shaker power supply system 70. In that regard, system 70 was unacceptable. In particular, it was incapable of reproducing the lower frequencies (100-3000 Hz) of the ventricle's spectra (at the increased acceleration levels). This region corresponds to the lowest shaker acceleration magnitude output per volt input. In other words, shaker 20 requires more power in this frequency range to simulate the ventricle's spectra. The five-band automotive frequency equalizer/booster is incapable of delivering the required power levels. Similarly, the booster is incapable of reducing the higher frequency content (3-10 kHz) so that the shaker output matches the ventricle's acceleration levels. An equalizer with better frequency control would reduce these tendencies.

The use of AC components in the drive system for embodiment 60 results in better power and frequency control of the input signal, thus better control over the acceleration output of the shaker. The AC stereo equalizer will serve as two equalizers (in series) for this application. It is possible to route the cassette player's signal through, for example, the left side of the stereo equalizer, then through the right side, yielding ±24 dB adjustment per band. This sort of arrangement is not possible with the automotive equalizer/booster of system 70 since its output signal was amplified making it unsuitable as an input signal for itself. (The input and output signals for the AC equalizer are at "line levels," that is, they are not amplified to magnitudes suitable for driving speakers, or shakers.) The AC equalizer also features ten frequency bands, as opposed to five, providing better frequency control.

For simulation, the Utah-100 ventricle was operated at 60 beats per minute, systolic to diastolic pressures of 110/70 mmHg, with 50% systole, at 5.7 liters per minute, in full-fill, full-eject mode. To eliminate as many variables as possible, the same accelerometer was used on the ventricle and then later on the shaker. It was mounted on the ventricle as the analog recording was being made, then on the shaker when the cassette tape was played back.

Figure 31A:
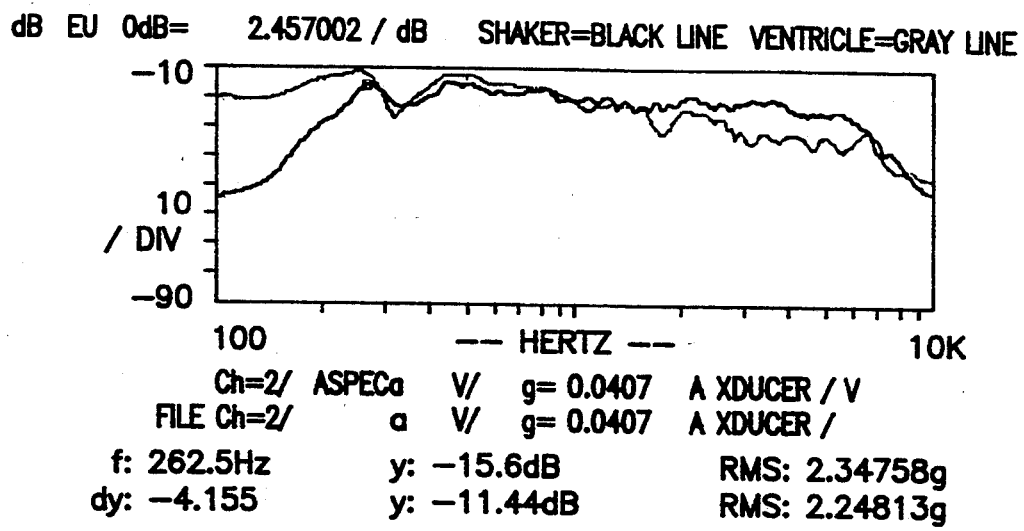
FIGS. 31A and 31B are plots of the shaker and ventricle spectra, where the application of the invention to simulation of artificial heart performance is shown, according to the present invention.
Figure 31B:
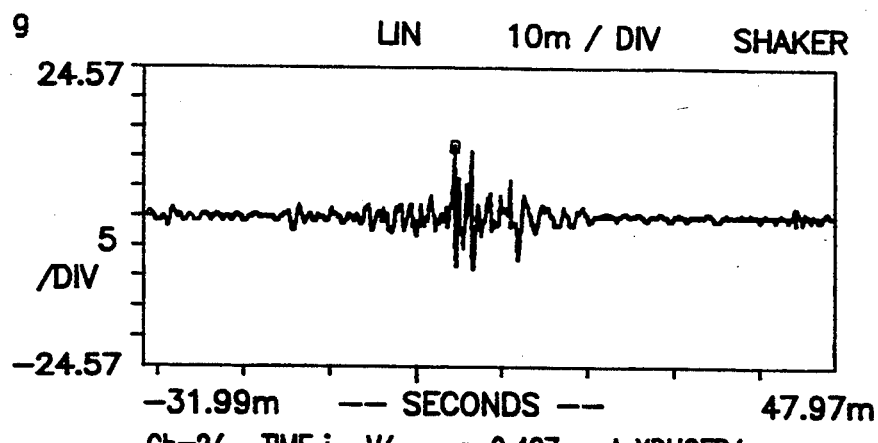

The upper plot of FIG. 31 shows the ventricle's autospectral density function (gray line) and the shaker's simulation (black line). The graph is shown with a logarithmic abscissa to better show the lower frequency values. The lower plot is a representative accelerometer time trace when mounted on the shaker.

As shown in FIG. 31, the shaker high frequency acceleration magnitudes were about 10 dB too high and its low frequency magnitudes were too low. In an effort to better simulate the lower frequencies, a capacitor was installed between the shaker and booster. The value of the capacitance (50 $\mu$F, micro-Farads) was chosen to create an electrical resonance at about 280 Hz. The resonance resulted in reduced system impedance, which translated to increased acceleration magnitudes for frequencies below 2000 Hz.

Figure 32A:
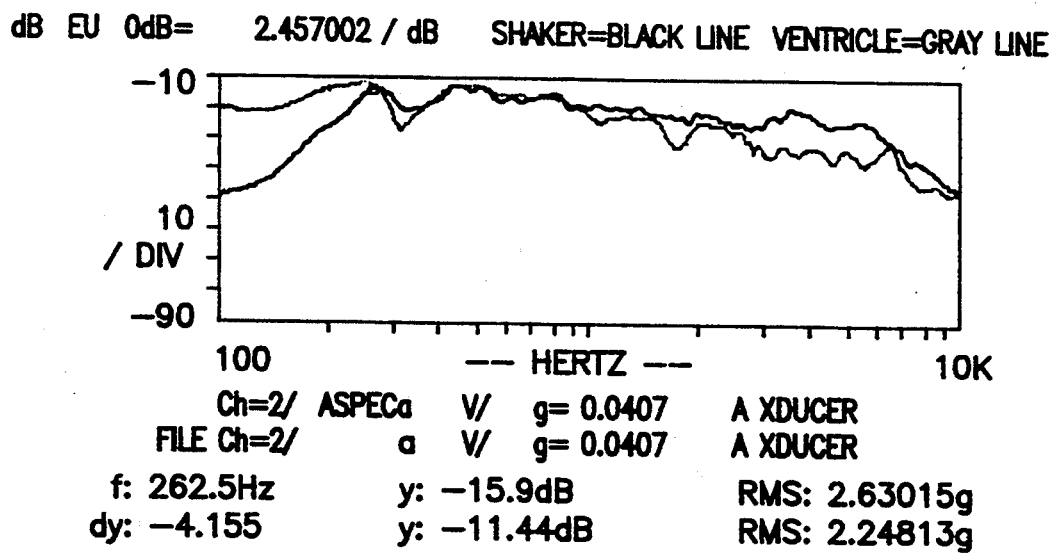
FIGS. 32A and 32B are comparisons of shaker system characteristics and artificial heart characteristics, according to the present invention.
Figure 32B:
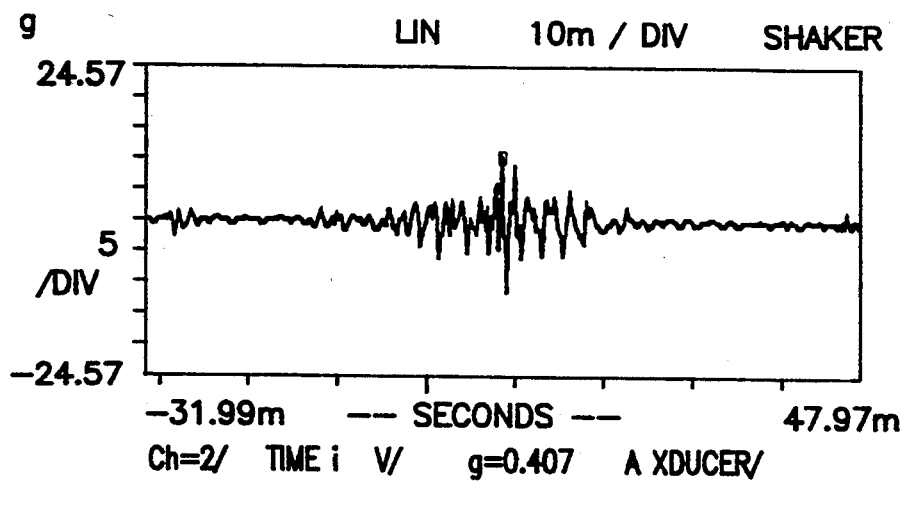

The shaker's spectrum (with resonance) is compared with the ventricle's spectrum in FIG. 32 (upper plot). Notice that the simulation with the electrical resonance resulted in a closer representation of the ventricle spectrum than did the simulation without the resonance.

For both FIG. 31 and 32, the spectra are combinations of the mitral and aortic events, i.e., analyzer settings were chosen such that it could sample continuously.

NON-IMPLANTABLE EMBODIMENTS

Figure 33:
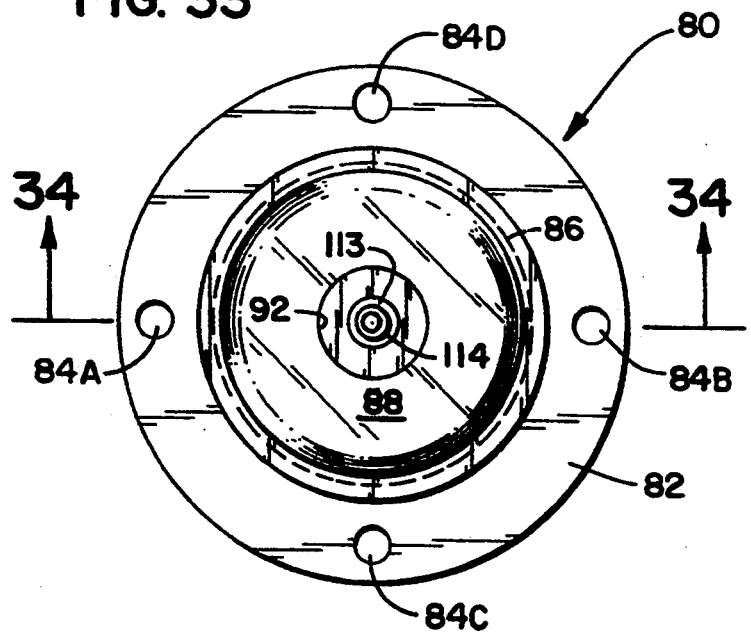
FIGS. 33 and 34 are a top plan view and cross-sectional side view, respectively, of the alternate embodiment 80 of the shaker according to the present invention.
Figure 34:
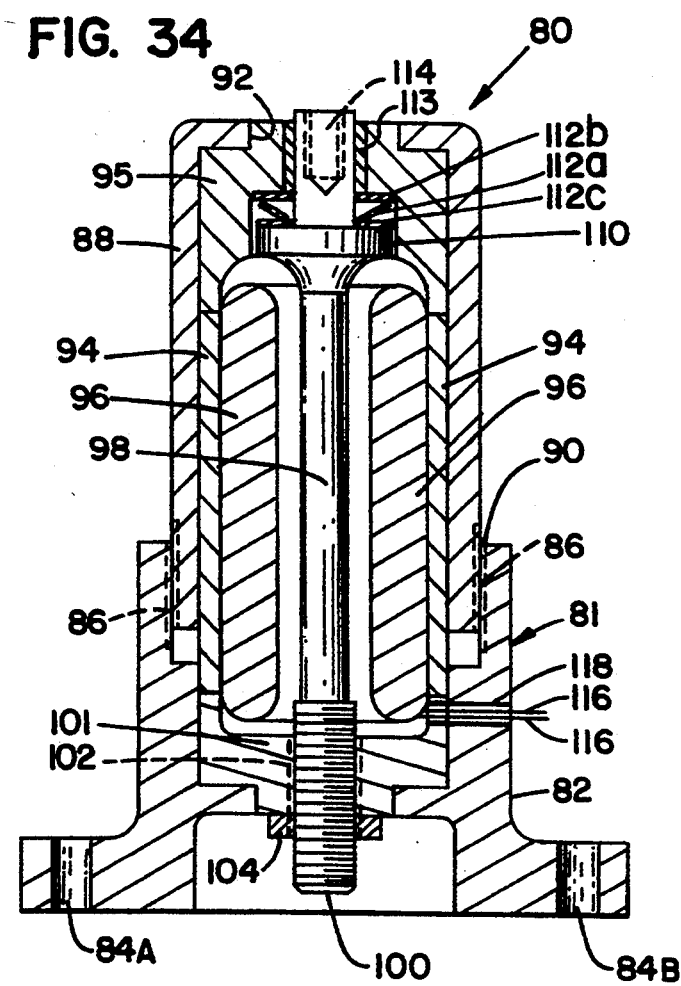

FIGS. 33 and 34 show an alternate non-implantable embodiment 80 according to the present invention. Shaker 80 includes a stainless steel (303 grade) housing 81, including a base 82 and extended portion 88. Base 82 includes mounting holes 84a, 84b, 84c and 84d, and interior threads 86. Portion 88 includes outside threads 90 to accomplish a threaded coupling to base housing 82, and an aperture 92. A cylindrical permanent magnet 94 and wound coil 96 assembly is mounted in housing 81, with a Terfenol-D rod 98 in the center. Rod 98 is positioned and held in place on one end with a pre-stress adjusting screw 100 (mild steel), which is threaded into a threaded hole 102 in an adjuster seat 101 (made of 1010 stainless steel) fitting in the base 82. A jam nut 104 (mild steel) is provided to fix the position of screw 100.

On the other end, a spring base 110 is placed against the end of rod 98 with a spring washer 112a mounted between hard washers 112b and 112c (shown in more detail in FIG. 35). The end of spring base 110 extends through aperture 92 in spring seat 95, which is lined with a self-lubricating bushing 113. Spring base 110, washers 112a, 112b, and 112c, and bushing 113 are preferably of the same materials and configuration as described above with respect to the corresponding components of embodiment 60 (and in particular those components shown in FIG. 26). Spring base 110 includes a threaded hole 114 via which it may be coupled to a mass to be vibrated. Electrical leads 116 extend from coil 96 through a through-hole 118 in housing portion 82.

The prestress adjustment scheme of embodiment 80 is advantageous because it eliminates the need for special or odd threads in the housing and on the spring seat/adjuster as required in the embodiments 20 and 60. Adjustment of prestress using this scheme is easier than it is for the scheme of embodiments 20 and 60, and allows for greater accuracy due to easier ergonomics of adjustment. Ascertaining the initial contact, no-load reference position of the spring washer with the seat/base/hard washer components, i.e., its (zero prestress) location, is more accurately determined, resulting in more accurate prestress adjustment.

Shaker 80 may also include an integrally mounted accelerometer to be used as a signal feedback source for regulation of the input voltage. It is also contemplated that shaker 80 include integral filtering of the input signal to minimize the influence of structural resonances on the system frequency response function.

ALTERNATE EMBODIMENT 80'

Figure 36:
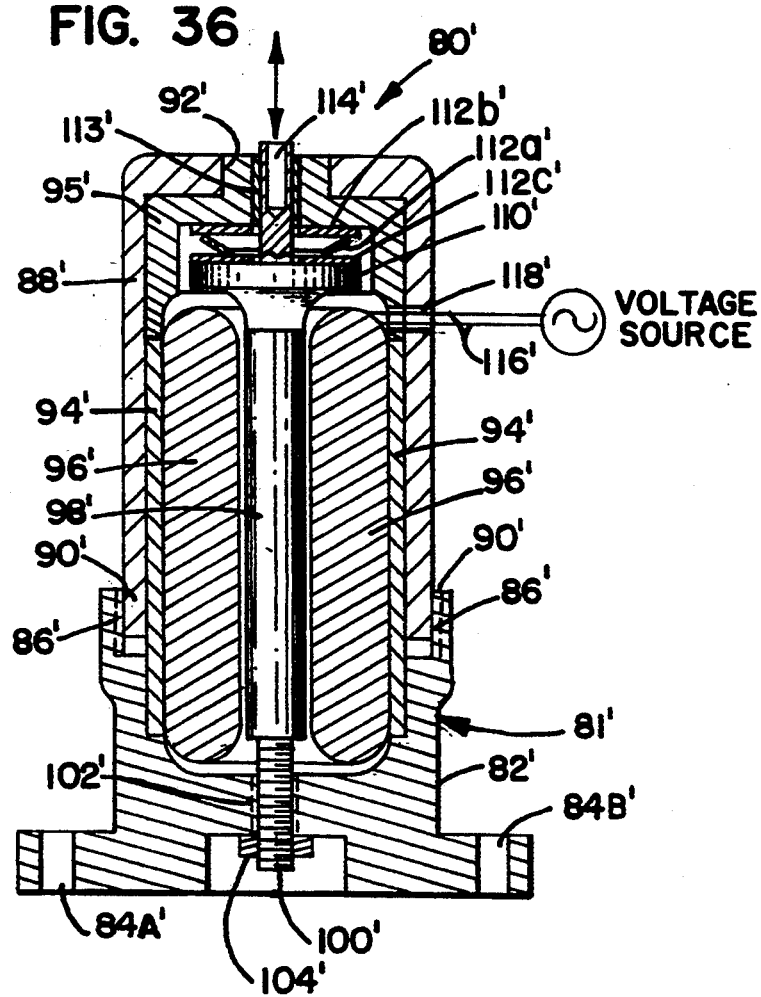
FIG. 36 is a cross-sectional side view of yet another alternate embodiment 80' according to the present invention.

Yet another alternate embodiment 80' is shown in FIG. 36. Embodiment 80' is of generally the same design as that of embodiment 80, and like components are numbered with like reference numerals with "prime" superscripts. Embodiment 80' differs from embodiment 80 in that adjuster seat 101 is omitted, as well as bushing 113. The through hole 118' is positioned differently.

ALTERNATE EMBODIMENT 80''

Figure 41:
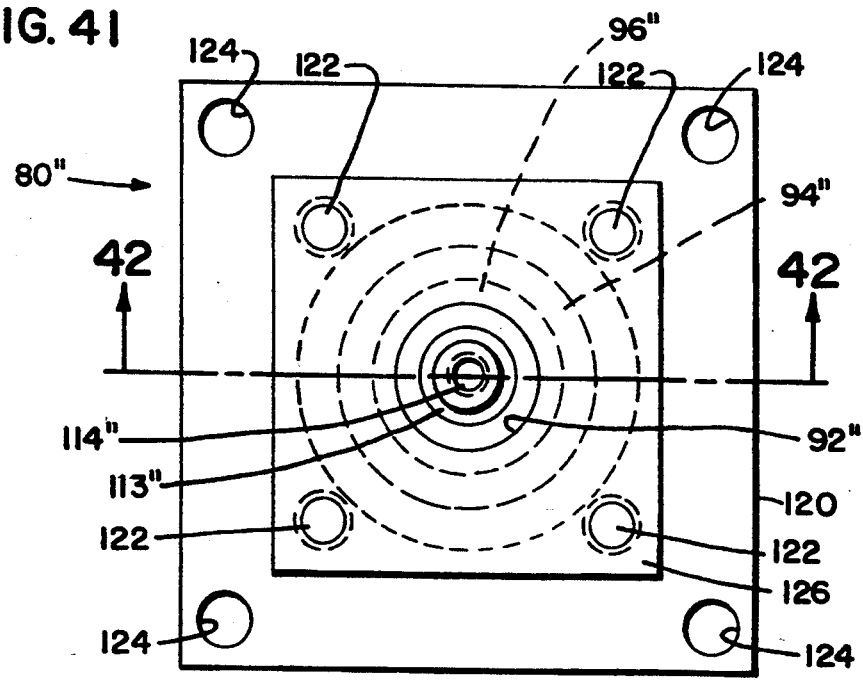
FIG. 41 is a top plan view of yet another alternate embodiment of the shaker design according to the present invention.
Figure 42:
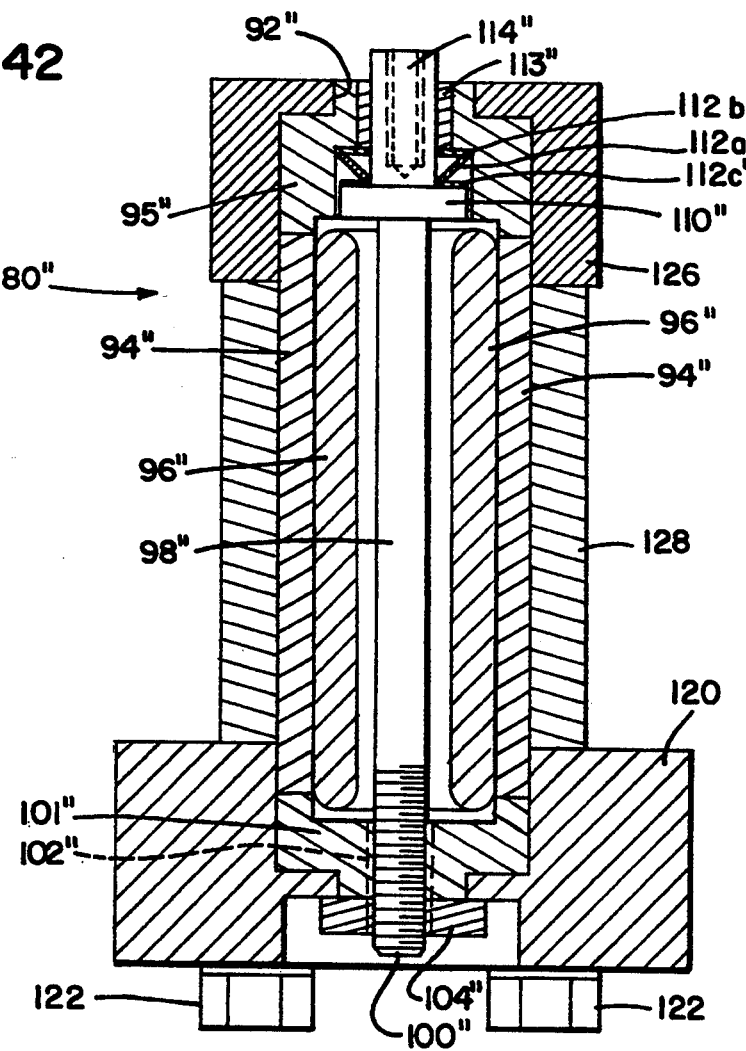
FIG. 42 is a cross-sectional view taken along the lines 42—42 of FIG. 41.

Another alternate embodiment 80'' is show in FIGS. 41 and 42. Embodiment 80'' is similar in design to embodiment 80, and like elements are numbered with like reference numerals with double prime designations. Embodiment 80'' differs from embodiment 80 in several respects. The housing consists of an aluminum base element 120 and top 125, held together with bolts 122. Mounting holes 124 are provided in base 120. Embodiment 80'' is also different in that it includes an additional winding 128. Winding 128 is used to add or subtract magnetic bias from permanent magnet 94''. A DC current is applied to winding 128 for this purpose. A current in one direction adds to the magnetic field of permanent magnet 94'', while a current in the other direction subtracts from it. The design of embodiment 80'' therefore allows the steady state magnetic bias applied to rod 98'' to be adjusted as desired.

AIR GAP IN FLUX CIRCUIT

Referring now to FIGS. 37, 38, 39 and 40, certain aspects of the magnetic flux circuit of the invention will be explained. All Terfenol shakers of the require an "air gap" somewhere in the magnetic circuit in order to allow for the motion of the rod—the basic function of Terfenol. The air gap scheme of the present invention represents an improvement over other known Terfenol transducer designs. To begin with, the gap used in the present invention is of constant volume/thickness. From a magnetic circuit point of view, the smaller the air gap, the better the circuit. The gap of the present invention uses a smaller (thinner) air gap than other known designs. In addition, the gap remains constant regardless of rod displacement, unlike other known designs.

The prior art air gap is shown in FIGS. 38 and 40. In the prior art design 130 of FIG. 38 features a Terfenol-D rod 131, coil 132, magnet 133 and end cap 134. The resulting flux path flows through gap 140, which varies in height "h" as the cap 134 moves back and forth. As a result, the volume of air in gap 140—$V = pi(2d+t)\cdot th$—varies as the rod expands and contracts. Also, the critical dimension, h, is a function of the length of the Terfenol-D rod, and typically is 0.020''. On the other hand, the air gap 142 of the present invention, as shown in FIGS. 37 and 39, is of constant volume, and furthermore can be made smaller by reducing the dimension "t". The constant volume of the air gap provides for a more uniform magnetic circuit which improves control over the shaker's vibration characteristics.

BACKGROUND INFORMATION ON TERFENOL-D

Several Terfenol-D magnetostrictive transducers were tested in an effort to assess Terfenol's suitability for shaker design according to the present invention. Its "high" frequency ($f > 2000$ Hz) response was unknown to the manufacturer since they considered frequencies greater than that to be prohibited by induced eddy currents. The manufacturer of Terfenol-D, Edge Technologies, Inc., believed that operation in excess of 1700 Hz resulted in large efficiency reductions. However, Terfenol-D was found to be capable of delivering frequencies up to 20 kHz (the limit of the analyzer used in this study). Subsequent testing has shown that frequencies in excess of 30 kHz are possible.

The initial tests demonstrated that Terfenol-D was relatively insensitive to mass loading. (The manufacturer reports that a $\frac{1}{4}''$ diameter rod of Terfenol-D is capable of producing about 100 lbs. of force.) Terfenol's corrosion resistance, or lack thereof, is not well documented. It is reported that it "reacted poorly" to alkali exposure. Sealing of the shaker must, therefore, be excellent for implanted units. Terfenol's fatigue characteristics are not extensively documented either. However, this was not considered to be a drawback for this application since the material would be in compression at all times. (Crack propagation within a material is typically aided by tensile loads and retarded by compressive loads.) The end of rod 26 must have less than a 0.3 degree cut. The rod 26 is cut to size using a wet grind and coolant. The manufacturer faces the material (which is very "brittle") with a wet belt sander, 180 grit.

Although the invention has been described herein in its preferred form, those skilled in the art will recognize that various modifications may be made thereto without departing from the spirit and scope of the claims appended hereto. For example but without limitation, the permanent magnets (19, 23, 94) used in the present invention can be replaced with a coil carrying a DC current, or with a DC current in the actuator coil (14, 24, 96). Also, it is possible that the spring base mass be of unitary construction.

What is claimed is:

1. A shaker, comprising:
   a magnetostrictive rod actuator;
   magnetic field means responsive to an electrical signal for varying the magnetic field applied to said actuator, the magnetic field means positioned around the actuator;
   a magnetically permeable base member for connecting the rod actuator to a mass, one end of the base member seated directly on the rod, and the other end extending away from the rod;
   a magnetically permeable member coaxially surrounding the other end of the base member and in contact with the magnetic field means, the other end of the base member moving coaxially inside the permeable member and defining an air gap of constant volume between it and the permeable member; and
   the varying magnetic field establishing a flux path travelling through the rod, to the base member, across the air gap, through the permeable member and through the magnetic field means, the varying magnetic field causing the actuator to expand and contract and the base member to vibrate.

2. A shaker according to claim 1 further including a spring to spring bias the base member against the actuator.

3. A shaker according to claim 1 further wherein the other end of the actuator is stationary.

4. A shaker according to claim 1 further including a mass connected to the base member.

5. A shaker according to claim 4 wherein the other end of the actuator is connected to another base member and another mass.

6. A shaker according to claim 5 wherein the actuator is mounted with both ends free so that the vibrations of said shaker are generally symmetrical about the midpoint of the actuator.

7. A shaker according to claim 1 wherein said magnetic field means and actuator are mounted inside a housing with the mass substantially flush with an opening of the housing.

8. A shaker according to claim 7 further wherein the shaker is sealed with a sealant to make it leak-proof.

9. A shaker according to claim 1 further wherein the magnetically permeable member is a spring seat/adjuster which includes a surface against which one end of the spring is seated, the other end of the spring seated against the base member.

10. A shaker according to claim 1 further wherein said excitation signal has a frequency of 1600 Hz or greater.

11. A shaker according to claim 1, wherein said magnetostrictive rod actuator is made from the material Terfenol-D.

12. A shaker, comprising:
a housing of low to non-ferromagnetic material;
an adjustor seat mounted in one end of the housing;
an adjusting screw, having high magnetic permeability, passing through a hole in said adjustor seat;
a magnetostrictive rod actuator having a longitudinal axis, and a first end and a second end, said first end of said actuator being seated against said adjusting screw;
magnetic field means for applying a magnetic field to said actuator, said field means surrounding the actuator and in direct physical contact to said adjustor seat;
a spring base having high magnetic permeability, and having a surface parallel to said longitudinal axis of said actuator and being seated on said second end of said actuator;
a spring seat, having high magnetic permeability, and being in direct physical contact with said magnetic field means, and having an opening for receiving said spring base, said opening having a surface parallel to said surface of said spring base, so that said actuator can move said spring base back and forth within said opening while the width of an air gap between said surface of said spring base and said surface of said opening remains constant;
a spring for biasing said spring base away from said spring seat and against said actuator; and
a jam-nut for fixing the position of said adjusting screw holding said actuator rod against said base member, so that a magnetic circuit extends through said adjustor seat, said magnetic field means, said spring seat, said air gap, said spring base, said actuator, and through said screw back to said adjustor seat.

13. A shaker, comprising:
a housing of low to non-ferromagnetic material;
an adjusting screw, having high magnetic permeability, passing through a hole in a first end of said housing;
a magnetostrictive rod actuator having a longitudinal axis, and a first end and a second end, said first end of said actuator being seated against said adjusting screw;
magnetic field means for applying a magnetic field to said actuator, said field means surrounding said actuator;
a spring base having high magnetic permeability, and having a surface parallel to said longitudinal axis of said actuator and being seated on said second end of said actuator;
a spring seat, having high magnetic permeability, and being in direct physical contact with said magnetic field means, and having an opening for receiving said spring base, said opening having a surface parallel to said surface of said spring base, so that said actuator can move said spring base back and forth within said opening while the width of an air gap between said surface of said spring base and said surface of said opening remains constant;
a spring for biasing said spring base away from said spring seat and against said actuator; and
a jam-nut for fixing the position of said adjusting screw holding said actuator rod against said spring base, so that a magnetic circuit extends through said magnetic field means, said spring seat, said air gap, said spring base, said actuator, and through said screw.

14. A shaker, comprising:
a housing of low to non-ferromagnetic material;
a magnetostrictive rod actuator having a longitudinal axis, and a first end and a second end;
a positioning means having high magnetic permeability, for holding said first end of said actuator proximate a first end of housing;
magnetic field means for applying a magnetic field to said actuator, said magnetic field means surrounding said actuator;
a spring base, having high magnetic permeability, and having a surface parallel to said longitudinal axis of said actuator and being seated on said second end of said actuator;
a spring seat, having high magnetic permeability, and being in direct physical contact with said magnetic field means, and having an opening for receiving said spring base, said opening having a surface parallel to said surface of said spring base, so that said actuator can move said spring base back and forth within said opening while the width of an air gap between surface of said spring base and said surface of said opening remains constant;
a spring for biasing said spring base away from said spring seat and against said actuator, so that a magnetic circuit extends through said magnetic field means, said spring seat, said air gap, said spring base, and said actuator.

15. A shaker in accordance with claim 12, 13 or 14, wherein said spring base includes an extended portion and said opening in said spring seat has an opposite end extending away from the portion coaxial with the spring base, and wherein the extended portion of the spring base is positioned in the opposite end of the spring seat, the shaker further including a self-lubricating bushing positioned between the extended portion of the spring base and said opposite end of the spring seat.

16. A shaker comprising:
a magnetostrictive rod actuator having a longitudinal axis;
a coil positioned adjacent said actuator;
a spring base proximate one end of said actuator;
a spring seat having an opening for receiving said spring base, wherein said opening has a surface proximate perpendicular to said longitudinal axis of said actuator, and said spring base has a surface proximately perpendicular to said longitudinal axis of said actuator;

two hardened flat washers, one laying on said surface of said spring base approximately parallel to said longitudinal axis of said actuator, and another laying on said surface of said spring seat approximately parallel to said longitudinal axis of said actuator;

a spring washer having a first end and a second end, and being positioned between said flat washers so that said first end of said spring washer is seated on said first flat washer, and said second end of said spring washer is seated on said second flat washer; and a seating member for the other end of the actuator on the other end of said shaker.

17. A method for generating vibrations, comprising the steps of:
   a) providing a magnetostrictive rod actuator having first and second ends;
   b) coupling a first mass to the first end of the actuator;
   c) mounting the actuator in a housing, the first mass positioned flush within an opening in the housing; and
   d) rapidly varying a magnetic field through the actuator to cause the actuator to expand and contract and the first mass to vibrate at a frequency in excess of 1600 Hz, relative to the second end of the actuator.

18. The method of claim 17, further comprising the step of sealing the housing.

19. A method for generating vibrations, comprising the steps of:
   a) providing a magnetostrictive rod actuator having first and second ends;
   b) coupling a magnetically permeable first base member to the actuator, the magnetically proneable first base member having one end seated directly on the first end of the actuator and an opposing end extending away from the actuator;
   c) coaxially enclosing at least a portion of the first base member with a magnetically permeable first member;
   d) providing a magnetic field source in contact with the magnetically permeable first member; and
   e) rapidly varying a magnetic field through the actuator, first base member and magnetically permeable first member to came the actuator to expand and contract at a frequency in excess of 1600 Hz, thereby vibrating the first base member along a longitudinal axis of the rod relative to the magnetically permeable first member.

20. A method according to claim 19, further comprising the step of coupling a mass to the first base member.

21. A method according to claim 19, further comprising the steps of:
   a) coupling a magnetically permeable second base member to the actuator, the magnetically permeable second base member having one end seated directly on the second end of the actuator and an opposing end extending away from the actuator;
   c) coaxially enclosing at least a portion of the second base member with a magnetically permeable second member;
   d) placing the magnetically permeable second member in contact with the magnetic field source; and
   e) rapidly varying the magnetic field through the actuator, second base member and magnetically permeable second member to cause the actuator to expand and contract at a frequency in excess of 1600 Hz, thereby also vibrating the second base member along a longitudinal axis of the rod relative to a midpoint of the actuator.

22. A method according to claim 21, further comprising the step of attaching a first mass to the first base member and a second mass to the second base member.

23. A method according to claim 19, further comprising the step of mounting the actuator with the first and second ends free so that the vibrations of the actuator are generally symmetrical about a midpoint of the actuator.

24. A method according to claim 19, further comprising the step of mounting the actuator inside a housing with the opposing end of the first base member positioned flush with an opening in the housing.

25. A method according to claim 24, further comprising the step of sealing the housing.

26. A method according to claim 19, further comprising the step of spring biasing the first base member in contact with the first end of the actuator.

27. A method according to claim 19, wherein said magnetostrictive rod actuator is made from the material Terfenol-D.

* * * * *

UNITED STATES PATENT AND TRADEMARK OFFICE
CERTIFICATE OF CORRECTION

PATENT NO. : 5,406,153
DATED : April 11, 1995
INVENTOR(S) : Flatau et al.

It is certified that error appears in the above-indentified patent and that said Letters Patent is hereby corrected as shown below:

Column 22 Line 3 "to came the" should read -- to cause the-- therefor.

Signed and Sealed this

Twenty-seventh Day of August, 1996

Attest:

BRUCE LEHMAN

*Attesting Officer*     *Commissioner of Patents and Trademarks*